United States Patent
Tischler

(10) Patent No.: US 9,583,691 B2
(45) Date of Patent: *Feb. 28, 2017

(54) THERMAL MANAGEMENT IN ELECTRONIC DEVICES WITH YIELDING SUBSTRATES

(71) Applicant: Michael A. Tischler, Vancouver (CA)

(72) Inventor: Michael A. Tischler, Vancouver (CA)

(73) Assignee: COOLEDGE LIGHTING INC., Richmond, British Columbia (CA)

(*) Notice: Subject to any disclaimer, the term of this patent is extended or adjusted under 35 U.S.C. 154(b) by 0 days.

This patent is subject to a terminal disclaimer.

(21) Appl. No.: 15/077,175

(22) Filed: Mar. 22, 2016

(65) Prior Publication Data

US 2016/0204324 A1    Jul. 14, 2016

Related U.S. Application Data

(63) Continuation of application No. 14/792,701, filed on Jul. 7, 2015, now Pat. No. 9,324,930, which is a
(Continued)

(51) Int. Cl.
*H01L 33/64* (2010.01)
*H01L 33/62* (2010.01)
*H01L 23/00* (2006.01)

(52) U.S. Cl.
CPC ............ *H01L 33/642* (2013.01); *H01L 24/14* (2013.01); *H01L 33/62* (2013.01); *H01L 33/641* (2013.01); *H01L 24/13* (2013.01); *H01L 24/16* (2013.01); *H01L 24/29* (2013.01); *H01L 24/32* (2013.01); *H01L 2224/13* (2013.01); *H01L 2224/131* (2013.01); *H01L 2224/133* (2013.01); *H01L 2224/13013* (2013.01); *H01L 2224/1329* (2013.01); *H01L 2224/13082* (2013.01); *H01L 2224/13124* (2013.01); *H01L 2224/13139* (2013.01); *H01L 2224/13144* (2013.01); *H01L 2224/13147* (2013.01); *H01L 2224/13186* (2013.01); *H01L 2224/1403* (2013.01); *H01L 2224/1415* (2013.01); *H01L 2224/14505* (2013.01); *H01L 2224/16225* (2013.01);
(Continued)

(58) Field of Classification Search
CPC ...... H01L 33/64; H01L 33/641; H01L 33/644
See application file for complete search history.

(56) References Cited

U.S. PATENT DOCUMENTS 8,018,139 B2    9/2011    Chou
8,384,121 B2    2/2013    Tischler et al.
(Continued)

FOREIGN PATENT DOCUMENTS

WO    2014140811    9/2014

OTHER PUBLICATIONS

PCT International Patent Application No. PCT/IB2014/000828, International Search Report and Written Opinion mailed Oct. 8, 2014, 5 pages.

*Primary Examiner* — Mark Prenty
(74) *Attorney, Agent, or Firm* — Morgan, Lewis & Bockius LLP

(57) ABSTRACT

In accordance with certain embodiments, heat-dissipating elements are integrated with semiconductor dies and substrates in order to facilitate heat dissipation therefrom during operation.

31 Claims, 18 Drawing Sheets

Related U.S. Application Data continuation of application No. 14/211,434, filed on Mar. 14, 2014, now Pat. No. 9,105,829.

(60) Provisional application No. 61/788,915, filed on Mar. 15, 2013.

(52) U.S. Cl.
CPC ............ *H01L 2224/17519* (2013.01); *H01L 2224/293* (2013.01); *H01L 2224/294* (2013.01); *H01L 2224/2929* (2013.01); *H01L 2224/29036* (2013.01); *H01L 2224/2939* (2013.01); *H01L 2224/29499* (2013.01); *H01L 2224/3003* (2013.01); *H01L 2224/32225* (2013.01); *H01L 2224/32227* (2013.01); *H01L 2224/73203* (2013.01); *H01L 2224/73204* (2013.01); *H01L 2924/07802* (2013.01); *H01L 2924/07811* (2013.01); *H01L 2924/12041* (2013.01); *H01L 2924/12042* (2013.01)

(56) References Cited

U.S. PATENT DOCUMENTS

| | | |
|---|---|---|
| 8,878,219 B2 | 11/2014 | Chitnis et al. |
| 9,105,829 B2 | 8/2015 | Tischler |
| 9,324,930 B2 * | 4/2016 | Tischler ............... H01L 33/642 |
| 2012/0187433 A1 | 7/2012 | Chen et al. |
| 2013/0248916 A1 | 9/2013 | Suehiro et al. |
| 2014/0264427 A1 | 9/2014 | Tischler |

* cited by examiner

THERMAL MANAGEMENT IN ELECTRONIC DEVICES WITH YIELDING SUBSTRATES

RELATED APPLICATIONS

This application is a continuation of U.S. patent application Ser. No. 14/792,701, filed Jul. 7, 2015, which is a continuation of U.S. patent application Ser. No. 14/211,434, filed Mar. 14, 2014, which claims the benefit of and priority to U.S. Provisional Patent Application No. 61/788,915, filed Mar. 15, 2013, the entire disclosure of each of which is incorporated herein by reference.

FIELD OF THE INVENTION

The present invention generally relates to thermal management of electronic devices, and more specifically to thermal management in array-based LED lighting systems.

BACKGROUND

Discrete light sources such as light-emitting diodes (LEDs) are an attractive alternative to incandescent light bulbs in illumination devices due to their higher efficiency, smaller form factor, longer lifetime, and enhanced mechanical robustness. However, the high cost of LEDs and associated heat-sinking and thermal-management systems have limited the widespread utilization of LEDs, particularly in general lighting applications.

The high cost of LED-based lighting systems has several contributors. LEDs are typically encased in a package and multiple packaged LEDs are used in each lighting system to achieve the required light intensity. In order to reduce costs, LED manufacturers have developed high-power LEDs, which can emit relatively higher light intensities by operating at relatively higher currents. While reducing the package count, these LEDs require relatively higher-cost packages to accommodate the higher current levels and to manage the significantly higher heat levels that result. The higher heat loads and currents, in turn, require more expensive thermal-management and heat-sinking systems that also add to the cost as well as to size of the system. Higher operating temperatures also lead to shorter lifetimes, degradation in luminous output, and reduced reliability.

Conventional LED thermal-management and heat-sinking systems have been devised to improve the heat transfer from the light-emitting junction in the LED to external heat-dissipating elements. Heat-dissipating elements typically include thermal slugs in the package, ceramic or metal submounts, large metal or ceramic heat sinks, and the like. Another example of a conventional heat-dissipating element is a high thermal conductivity wiring board, such as a metal core printed circuit board. Thermally conductive underfills may also be used to aid in transfer of heat from the package to the wiring board.

In conventional systems, the electrical traces may be utilized as heat-dissipating elements; in such systems, the LED typically has a pair of electrical contacts in electrical and thermal engagement with the traces, which are typically composed of a metallic material. Heat generated by the LED flows through its electrical contacts into the traces. Heat may also flow out the body of the LED, and be dissipated through an underfill that has a relatively high thermal conductivity. Typical underfills include thermally conductive adhesives or pastes. Typically, the traces and the underfill are thermally coupled to a high thermal conductivity substrate, such as AlN, a metal core printed circuit board, or other high thermal conductivity material. Because the substrate has high thermal conductivity there is a relatively large area—approximately the entire chip area—through which heat may flow from the chip to the substrate. The high thermal conductivity substrate dissipates heat transferred to it and this substrate is therefore an important element in thermal management of high-power LED-based lighting systems.

An alternative approach to conventional high-power LED-based lighting systems is the use of an array of relatively small LEDs mounted on a low cost plastic base substrate and driven at relatively low current. Examples of such systems are disclosed in U.S. Pat. No. 8,384,121, filed Jun. 29, 2011 (the '121 patent), U.S. Patent Application Publication No. 2014/0062318, filed Mar. 13, 2013, and U.S. Patent Application Publication No. 2014/0062316, filed Aug. 19, 2013, the entire disclosure of each of which is incorporated herein by reference. Such systems typically feature conductive traces, formed over a plastic substrate, and which are used to interconnect and provide power to an LED through its electrical contacts. When the LEDs on the plastic substrate are operated at low drive currents, no additional thermal management may be required, because the relatively small amount of heat generated by each LED is distributed over the entire array area. Such heat distribution may be through the conductive traces, which typically have a relatively larger thermal conductivity than the plastic substrate. Thus, while these systems typically have significantly lower cost because there is no need for additional heat sinking or thermal management, they may be limited to relatively low drive currents.

In view of the foregoing, a need exists for systems and techniques enabling the design and manufacture of LED-based lighting systems, as well as corresponding thermal-management techniques, capable of supporting relatively high LED drive currents at low cost.

SUMMARY

In accordance with various embodiments, the invention provides an electrically driven lighting system design that features an electrically insulating (e.g., plastic) substrate having opposed first and second surfaces with circuit traces that are electrically conductive. The substrate contains one or more heat-dissipating devices disposed upon and in parallel relationship with the substrate. Multiple light-emitting elements (LEEs), for example, LED semiconductor dies, are disposed on the substrate, and each LEE has a pair of (or more) electrical contacts. Each LEE may also include heat-dissipating devices, as described in more detail below. In general, each LEE is in thermal communication with one or more heat-dissipating devices for conveying heat from the LEE to the heat-dissipating device(s) and thus away from the LEE. Embodiments of the invention also include techniques for fabricating the assembly including the substrate, LEEs, and heat-dissipating devices. Such techniques may include disposing each LEE onto the substrate and bringing the LEE and one or more heat-dissipating devices into thermal contact.

In some embodiments, the LEE has a p-contact that is asymmetrically larger than the n-contact, in order to enable the greater transfer of heat from the p-region of the LED where more surface area is available for heat transfer. The asymmetrically larger p-contact generally transfers heat more effectively than the n-contact, because the p-contact directly underlies the region below the junction where light and heat are produced in the LEE. The heat transfer from the p-region follows the shortest path through the p-contact and into heat-dissipating elements such as the conductive traces and the substrate. The p-contact therefore has, in various embodiments of the invention, superior heat transfer ability relative to the n-contact. (In embodiments in which the n-region of the LEE underlies the light-producing junction, the n-contact may be asymmetrically larger than the p-contact.)

In various embodiments, relatively large electrical contacts are utilized on the LEE to increase the reliability of the LEE array assembly, because in general a larger contact surface area yields a greater probability of sufficient electrical and thermal bonding of the LEE onto the conductive traces during die attachment. LEEs having asymmetrically larger p-contacts may be placed in an offset position on the conductive traces in order to increase the electrical contact area and thermal transfer region between the asymmetrically larger p-contact and its corresponding conductive trace. Specifically, the larger contact of the LEE may overlap its corresponding conductive trace to a greater extent than the smaller contact of the LEE.

In some embodiments, the gap between each pair of conductive traces on the substrate is minimized. A smaller gap between the conductive traces may increase the contact area and thus reduce the thermal resistance between the LEE contacts and the conductive traces. For example, in some embodiments, the gap between the conductive traces may be less than 300 µm, or less than 200 µm, or less than 100 µm, or even less than 50 µm or 25 µm. A smaller gap between the conductive traces may increase the reliability of the LEE array assembly by providing more misalignment tolerance of electrically-coupled and thermally-coupled LEE contacts onto the conductive trace. A narrower gap may also reduce the manufacturing tolerance in the bonding process of LEEs onto the substrate. As a result, fewer bonding errors occur during the LEE array assembly process.

For LEEs having asymmetrically sized contacts, the smaller (e.g., n-) contact may feature a via perpendicularly disposed therethrough in order to provide greater surface area in the corresponding semiconductor (e.g., n-) region and enable greater transfer of heat from that region of the LEE, through the contact, and into the conductive trace and substrate. Such vias may also be utilized for larger contacts and for one or both contacts in embodiments in which the contacts are substantially the same size.

In various embodiments, one or more LEE thermal pads that are not in electrical communication with the either the p-contact or the n-contact are disposed between and isolated from the p-contact and the n-contact (e.g., formed atop an isolation layer). An isolation layer under an LEE thermal pad may be very thin, as it is under the LEE thermal pad and thus needs not be as robust to survive the die-attach assembly process. In some embodiments, the isolation layer thickness is less than 0.25 µm, less than 0.1 µm, less than 0.05 µm, less than 0.02 µm, or less than even 100 Å or 50 Å.

In some embodiments, an LEE thermal pad includes or consists essentially of a relatively high thermal conductivity material such as polysilicon, poly SiC, poly AlN, SiC, AlN, and amorphous versions of these and other materials. In some embodiments, the LED thermal pad includes or consists essentially of one or more relatively high thermal conductivity metals such as gold, copper, solder, aluminum, silver, carbon, silver ink, carbon ink, or the like. In some embodiments, the LEE thermal pad has a width that is less than the spacing between the conductive traces to which the LEE is bonded, thus preventing the LEE thermal pad from electrically shorting the conductive traces. In other embodiments, the LEE thermal pad has a width that is greater than the spacing between the conductive traces to which the LEE is bonded, and it does contact one but not both of the conductive traces. However, in such embodiments the LEE is offset relative to the gap centerline, thus preventing the LEE thermal pad from electrically shorting the conductive traces.

In accordance with various embodiments of the present invention, a substrate thermal trace material is placed or formed on the substrate in the gap between the conductive traces (to which an LEE is bonded) in order to enhance thermal conduction from the LEE thermal pad into the substrate. In some embodiments, the substrate thermal trace material may include or consist essentially of the same material as that of the substrate, or the substrate thermal trace material may be a different material. In various embodiments, the substrate thermal trace material is a material that has a relatively high thermal conductivity such as polysilicon, poly SiC, poly AlN, SiC, AlN, and amorphous versions of these and other materials. Embodiments of the invention may utilize one or more LEE thermal pads with or without the use of the substrate thermal trace material.

The substrate thermal trace material may be the same material as the conductive traces on the substrate. However, in other embodiments, the substrate thermal trace material may be substantially electrically insulating. In yet additional embodiments, a relatively high thermal conductivity material that is substantially electrically isolating, for example an adhesive or paste, is placed or formed in the area around the substrate thermal trace material.

In various embodiments of the invention in which large amounts of heat are to be channeled away from LEEs, the heat-dissipation devices detailed herein may themselves be thermally (and even mechanically) coupled to larger bulk heat sinks (e.g., high-surface-area and/or finned "blocks" of a thermally conductive material) and/or to active heat-removal devices such as fans.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of LEEs include solid-state, organic, polymer, phosphor-coated or high-flux LEDs, microLEDs (described below), laser diodes or other similar devices as would be readily understood. The emitted radiation of a LEE may be visible, such as red, blue or green, or invisible, such as infrared or ultraviolet. A LEE may produce radiation of a spread of wavelengths. A LEE may feature a phosphorescent or fluorescent material for converting a portion of its emissions from one set of wavelengths to another. A LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective.

An LEE may be of any size. In some embodiments, an LEE has one lateral dimension less than 500 µm, while in other embodiments an LEE has one lateral dimension greater than 500 µm. Exemplary sizes of a relatively small LEE may include about 175 µm by about 250 µm, about 250 µm by about 400 µm, about 250 µm by about 300 µm, or about 225 µm by about 175 µm. Exemplary sizes of a relatively large LEE may include about 1000 µm by about 1000 µm, about 500 µm by about 500 µm, about 250 µm by about 600 µm, or about 1500 µm by about 1500 µm. In some embodiments, an LEE includes or consists essentially of a small LED die, also referred to as a "microLED." A microLED generally has one lateral dimension less than about 300 µm. In some embodiments, the LEE has one lateral dimension less than about 200 µm or even less than about 100 µm. For example, a microLED may have a size of about 225 µm by about 175 µm or about 150 µm by about 100 µm or about 150 µm by about 50 µm. In some embodiments, the surface area of the top surface of a microLED is less than 50,000 µm² or less than 10,000 µm². The size of the LEE is not a limitation of the present invention, and in other embodiments the LEE may be relatively larger, e.g., the LEE may have one lateral dimension on the order of at least about 1000 µm or at least about 3000 p.m. In some embodiments the LEE may emit white light or substantially white light.

In some embodiments, various elements such as substrates or lightsheets are "flexible" in the sense of being pliant in response to a force and resilient, i.e., tending to elastically resume an original configuration upon removal of the force. Such elements may have a radius of curvature of about 1 m or less, or about 0.5 m or less, or even about 0.1 m or less. In some embodiments, flexible elements have a Young's Modulus less than about 100 N/m², less than about 50 N/m², or even less than about 10 N/m². In some embodiments, flexible elements have a Shore A hardness value less than about 100; a Shore D hardness less than about 100; and/or a Rockwell hardness less than about 150.

In an aspect, embodiments of the invention feature an electronic device that includes or consists essentially of a substrate, a light-emitting diode (LED), and a thermal pad. The substrate has first and second conductive traces on a first surface thereof, and the first and second conductive traces are separated on the substrate by a gap therebetween. The LED has first and second distinct electrical contacts on a first LED surface thereof, and the first and second contacts are attached and electrically coupled to, respectively, the first and second conductive traces. At least a portion of the thermal pad is disposed within the gap between the first and second conductive traces. At least a portion of the thermal pad is disposed between the first surface of the substrate and the LED. The thermal pad is electrically isolated from the first and/or second electrical contacts. The thermal pad thermally couples the LED to the substrate without electrically coupling the LED to the substrate, and the thermal pad may have a thermal conductivity greater than 75 W/(m·K), or even greater than 150 W/(m·K).

Embodiments of the invention may include one or more of the following in any of a variety of different combinations. The thermal pad may be partially disposed over only one of the first or second conductive traces but not the other. A surface area of the thermal pad may be greater than a surface area of the first electrical contact and/or a surface area of the second electrical contact. The thermal pad may be bonded to the first surface of the substrate and to the first LED surface. The thermal pad may be bonded to the first surface of the substrate but not bonded to the first LED surface. The thermal pad may be bonded to the first surface of the substrate via a thermally conductive adhesive, thermally conductive epoxy, adhesive, anisotropic conductive adhesive, thermal grease, and/or a thermal gasket. The thermal pad may be spaced away from and not in direct contact with the LED. The thermal pad may be bonded to the first LED surface but not bonded to the substrate. The thermal pad may be spaced away from and not in direct contact with the substrate. The thermal pad may be in direct contact with the first surface of the substrate.

The thermal pad may be bonded to the first surface of the substrate, and a second thermal pad may be bonded to the first LED surface and disposed between the thermal pad and the first LED surface. The second thermal pad may be attached and thermally coupled to the thermal pad. The second thermal pad may be attached to the thermal pad via a thermally conductive adhesive, thermally conductive epoxy, adhesive, anisotropic conductive adhesive, thermal grease, and/or a thermal gasket. A surface area of the thermal pad may be at least two times, at least five times, or at least ten times a surface area of the second thermal pad. The thermal pad may include or consist essentially of aluminum, copper, gold, silver, carbon, silver ink, copper ink, and/or carbon ink, and the second thermal pad may include or consist essentially of gold, silicon carbide, and/or aluminum nitride. The thermal pad may be electrically isolated from the first and/or second conductive traces. The thermal pad may include or consist essentially of a material having a thermal conductivity in the range of about 150 W/(m·K) to about 600 W/(m·K). The thermal pad may include or consist essentially of aluminum, copper, gold, silver, carbon, silicon carbide, aluminum nitride, silver ink, copper ink, and/or carbon ink.

A backside thermal pad may be disposed on a second surface of the substrate opposite the first surface. At least one thermal via may extend from the first surface of the substrate to the second surface of the substrate and thermally couple the thermal pad to the backside thermal pad. The backside thermal pad may have a thermal conductivity greater than 75 W/(m·K), or even greater than 150 W/(m·K). The at least one thermal via may be bonded to the thermal pad and to the backside thermal pad. The at least one thermal via may include or consist essentially of aluminum, copper, gold, silver, carbon, carbon ink, silver ink, copper ink, silicon, silicon carbide, and/or aluminum nitride. The backside thermal pad may include or consist essentially of aluminum, copper, gold, silver, carbon, silicon, carbon ink, silver ink, copper ink, silicon carbide, and/or aluminum nitride. The backside thermal pad may include or consist essentially of a material having a thermal conductivity in the range of about 150 W/(m·K) to about 600 W/(m·K). The at least one thermal via may include or consist essentially of a material having a thermal conductivity in the range of about 10 W/(m·K) to about 600 W/(m·K). Each thermal via may have a thermal resistance in the range of about 0.05° K/W to about 10° K/W. The at least one thermal via may include or consist essentially of (i) a crimp-type via between the first and second surfaces of the substrate, (ii) a staple extending through the substrate in at least two discrete locations, (iii) a rivet extending through the substrate, (iv) a clamp extending around the substrate but not through the substrate, and/or (v) a wire. The at least one thermal via may include or consist essentially of a through-hole extending through the substrate and substantially filled with a thermally conductive material having a thermal conductivity greater than 10 W/(m·K). The thermally conductive material may include or consist essentially of aluminum, copper, gold, silver, carbon, carbon ink, silver ink, copper ink, conductive adhesive, and/or conductive epoxy.

The substrate may be flexible. The substrate may include or consist essentially of polyethylene naphthalate, polyethylene terephthalate, epoxy, polycarbonate, polyethersulfone, polyester, polyimide, polyethylene, and/or silicone. The first and second contacts may be bonded to the first and second conductive traces by an adhesive. The adhesive may include or consist essentially of a pressure-activated adhesive, an anisotropic conductive adhesive, a conductive adhesive, a non-conductive adhesive, a heat-activated adhesive, and/or a UV-activated adhesive. The first and second contacts may be bonded to the first and second conductive traces by solder. The thermal pad may be bonded to the first and second conductive traces by an adhesive. The adhesive may include or consist essentially of a pressure-activated adhesive, an anisotropic conductive adhesive, a conductive adhesive, a non-conductive adhesive, a heat-activated adhesive, and/or a UV-activated adhesive. The first and second contacts may be bonded to the thermal pad by solder. The first and second conductive traces may include or consist essentially of aluminum, copper, gold, silver, carbon, silver ink, and/or chromium.

The LED may include a wavelength-conversion material (e.g., disposed around at least a portion of the LED semiconductor layer structure and/or within or on at least a portion of a package surrounding the semiconductor layer structure) for absorbing a portion of the light emitted by the LED and emitting light of a different wavelength. The light emitted by the LED and the light emitted by the wavelength-conversion material may combine to form substantially white light. The LED may include or consist essentially of one or more gallium nitride-based semiconductors (e.g., GaN, InGaN, InAlGaN, AlGaN, etc.). The LED may be part of one of a plurality of light-emitting strings disposed on the first surface of the substrate and interconnected in an electric circuit. Each light-emitting string may include or consist essentially of a plurality of LEDs spaced along and electrically interconnected in the light-emitting string. The electronic device may include a power source for energizing the plurality of light-emitting strings and/or circuitry for controlling the current through the plurality of light-emitting strings. The LED may include or consist essentially of a bare-die LED or a packaged LED.

In another aspect, embodiments of the invention feature an electronic device that includes or consists essentially of a substrate, first and second conductive traces, a backside thermal pad, a thermal via, and a light-emitting diode (LED). The substrate has a first surface and a second surface opposite the first surface. The first and second conductive traces are disposed on the first surface of the substrate and separated on the substrate by a gap therebetween. The backside thermal pad is on the second surface of the substrate. The backside thermal pad may have a thermal conductivity greater than 75 W/(m·K), or even greater than 150 W/(m·K). The thermal via extends from the first surface of the substrate to the second surface of the substrate and thermally couples the first conductive trace to the backside thermal pad. The thermal via may have a thermal conductivity greater than 10 W/(m·K), or even greater than 75 W/(m·K), or even greater than 150 W/(m·K). The LED has first and second distinct electrical contacts on a first LED surface thereof. The first and second contacts are attached and electrically coupled to, respectively, the first and second conductive traces.

Embodiments of the invention may include one or more of the following in any of a variety of different combinations. The thermal via may be bonded to the first conductive trace and to the backside thermal pad. A second backside thermal pad, distinct from the backside thermal pad, may be disposed on the second surface of the substrate. A second thermal via may extend from the first surface of the substrate to the second surface of the substrate and thermally couple the second conductive trace to the second backside thermal pad. The thermal via may be bonded to the first conductive trace and to the backside thermal pad. The second thermal via may be bonded to the second conductive trace and to the second backside thermal pad. The thermal via may electrically couple the first conductive trace to the backside thermal pad. A surface area of the thermal via substantially parallel to the first and/or second surfaces of the substrate may be in the range of about 0.1 mm$^2$ to about 10 mm$^2$. The thermal via may include or consist essentially of aluminum, copper, gold, silver, carbon, carbon ink, silver ink, copper ink, silicon, silicon carbide, and/or aluminum nitride. The backside thermal pad may include or consist essentially of aluminum, copper, gold, silver, carbon, carbon ink, silver ink, copper ink, and/or silicon. The backside thermal pad may include or consist essentially of a material having a thermal conductivity in the range of about 150 W/(m·K) to about 600 W/(m·K). The thermal via may include or consist essentially of a material having a thermal conductivity in the range of about 10 W/(m·K) to about 600 W/(m·K). The thermal via may have a thermal resistance in the range of about 0.05° K/W to about 10° K/W. The thermal via may include or consist essentially of (i) a crimp-type via between the first and second surfaces of the substrate, (ii) a staple extending through the substrate in at least two discrete locations, (iii) a rivet extending through the substrate, (iv) a clamp extending around the substrate but not through the substrate, and/or (v) a wire. The thermal via may include or consist essentially of a through-hole extending through the substrate and substantially filled with a thermally conductive material having a thermal conductivity greater than 10 W/(m·K). The thermally conductive material may include or consist essentially of aluminum, copper, gold, silver, carbon, conductive adhesive, and/or conductive epoxy.

The substrate may be flexible. The substrate may include or consist essentially of polyethylene naphthalate, polyethylene terephthalate, epoxy, polycarbonate, polyethersulfone, polyester, polyimide, polyethylene, and/or silicone. The first and second contacts may be bonded to the first and second conductive traces by an adhesive. The adhesive may include or consist essentially of a pressure-activated adhesive, an anisotropic conductive adhesive, a conductive adhesive, a non-conductive adhesive, a heat-activated adhesive, and/or a UV-activated adhesive. The first and second contacts may be bonded to the first and second conductive traces by solder. The first and second conductive traces may include or consist essentially of aluminum, copper, gold, silver, carbon, carbon ink, copper ink, silver ink, and/or chromium. The LED may include a wavelength-conversion material (e.g., disposed around at least a portion of the LED semiconductor layer structure and/or within or on at least a portion of a package surrounding the semiconductor layer structure) for absorbing a portion of the light emitted by the LED and emitting light of a different wavelength. The light emitted by the LED and the light emitted by the wavelength-conversion material may combine to form substantially white light. The LED may include or consist essentially of one or more gallium nitride-based semiconductors (e.g., GaN, InGaN, InAlGaN, AlGaN, etc.). The LED may be part of one of a plurality of light-emitting strings disposed on the first surface of the substrate and interconnected in an electric circuit. Each light-emitting string may include or consist essentially of a plurality of LEDs spaced along and electrically interconnected in the light-emitting string. The electronic device may include a power source for energizing the plurality of light-emitting strings and/or circuitry for controlling the current through the plurality of light-emitting strings. One or more additional LEDs may be disposed on the first surface of the substrate. The electronic device may include a power source for energizing the LED and the one or more additional LEDs, and/or circuitry for controlling current through the LED and the one or more additional LEDs. At least a portion of the power energizing the LED or the one or more additional LEDs may be supplied thereto through the backside thermal pad and thermal via.

The electronic device may include a thermal pad. At least a portion of the thermal pad may be disposed within the gap between the first and second conductive traces. At least a portion of the thermal pad may be disposed between the first surface of the substrate and the LED. The thermal pad may be electrically isolated from the first and/or second electrical contacts. The thermal pad may thermally couple the LED to the substrate without electrically coupling the LED to the substrate. The thermal pad may have a thermal conductivity greater than 75 W/(m·K), or even greater than 150 W/(m·K). The thermal pad may be partially disposed over only one of the first or second conductive traces but not the other. A surface area of the thermal pad may be greater than a surface area of the first electrical contact and/or a surface area of the second electrical contact. The thermal pad may be bonded to the first surface of the substrate and to the first LED surface. The thermal pad may be bonded to the first surface of the substrate but not bonded to the first LED surface. The thermal pad may be bonded to the first surface of the substrate via a thermally conductive adhesive, thermally conductive epoxy, adhesive, anisotropic conductive adhesive, thermal grease, and/or a thermal gasket. The thermal pad may be spaced away from and not in direct contact with the LED. The thermal pad may be bonded to the first LED surface but not bonded to the substrate. The thermal pad may be spaced away from and not in direct contact with the substrate. The thermal pad may be in direct contact with the first surface of the substrate.

The thermal pad may be bonded to the first surface of the substrate, and a second thermal pad may be bonded to the first LED surface and disposed between the thermal pad and the first LED surface. The second thermal pad may be attached and thermally coupled to the thermal pad. The second thermal pad may be attached to the thermal pad via a thermally conductive adhesive, thermally conductive epoxy, adhesive, anisotropic conductive adhesive, thermal grease, and/or a thermal gasket. A surface area of the thermal pad may be at least two times, at least five times, or at least ten times a surface area of the second thermal pad. The thermal pad may include or consist essentially of aluminum, copper, gold, silver, silver ink, copper ink, carbon ink, and/or carbon, and/or the second thermal pad may include or consist essentially of gold, silicon carbide, and/or aluminum nitride. The thermal pad may be electrically isolated from at least one of the first or second conductive traces. The thermal pad may include or consist essentially of a material having a thermal conductivity in the range of about 150 W/(m·K) to about 600 W/(m·K). The thermal pad may include or consist essentially of aluminum, copper, gold, silver, carbon, silicon, carbon ink, silver ink, copper ink, silicon carbide, and/or aluminum nitride. The LED may include or consist essentially of a bare-die LED or a packaged LED.

In yet another aspect, embodiments of the invention feature a bare-die light-emitting diode (LED) that includes or consists essentially of a plurality of semiconductor layers configured for light emission and first and second contacts. The plurality of semiconductor layers includes or consists essentially of a first semiconductor layer having a first doping polarity (i.e., n-type or p-type) and a second semiconductor layer having a second doping polarity opposite the first doping polarity. The first contact is electrically coupled to the first semiconductor layer and disposed on a first surface of the bare-die LED (where the bare-die LED also has a second surface opposite the first surface). The second contact is electrically coupled to the second semiconductor layer and disposed on the first surface of the bare-die LED. The first semiconductor layer is disposed between the second semiconductor layer and the first surface of the bare-die LED (i.e., the second semiconductor layer is closer to the first surface of the bare-die LED), and a surface area of the first contact at least two times larger than a surface area of the second contact.

Embodiments of the invention may include one or more of the following in any of a variety of different combinations. The surface area of first contact may be at least five times, or even at least ten times, larger than the surface area of the second contact. The first and second contact may be spaced apart from each other by a gap therebetween on the first surface of the LED. A midpoint of the gap may be offset from a midpoint of a length of the LED extending in a direction from the first contact to the second contact. The midpoint of the gap may be offset from the midpoint of the length of the LED by at least 5%, or even by at least 20%, of the length of the LED.

In an additional aspect, embodiments of the invention feature an electronic device that includes or consists essentially of a substrate, a light-emitting diode (LED), and a thermal pad. The substrate has first and second conductive traces on a first surface thereof. The first and second conductive traces are separated on the substrate by a gap therebetween and include or consist essentially of aluminum and/or copper. The LED has first and second distinct electrical contacts on a first LED surface thereof. The first and second contacts are attached and electrically coupled to, respectively, the first and second conductive traces via solder and/or an anisotropic conductive adhesive. At least a portion of the thermal pad is disposed within the gap between the first and second conductive traces. At least a portion of the thermal pad is disposed between the first surface of the substrate and the LED. The thermal pad is electrically isolated from the first and/or second electrical contacts. The thermal pad thermally couples the LED to the substrate without electrically coupling the LED to the substrate. The thermal pad includes or consists essentially of aluminum and/or copper. The thermal pad has a thermal conductivity greater than 150 W/(m·K). A thickness of the thermal pad may be less than about 150 µm.

In another aspect, embodiments of the invention feature an electronic device that includes or consists essentially of a substrate, a light-emitting diode (LED), and a thermal pad. The substrate has first and second conductive traces on a first surface thereof. The first and second conductive traces are separated on the substrate by a gap therebetween and include or consist essentially of aluminum and/or copper. The LED has first and second distinct electrical contacts on a first LED surface thereof. The first and second contacts are attached and electrically coupled to, respectively, the first and second conductive traces via solder and/or an anisotropic conductive adhesive. At least a portion of the thermal pad is disposed within the gap between the first and second conductive traces. At least a portion of the thermal pad is disposed between the first surface of the substrate and the LED. The thermal pad is electrically isolated from the first and/or second electrical contacts. The thermal pad thermally couples the LED to the substrate without electrically coupling the LED to the substrate. The thermal pad may include or consist essentially of aluminum and/or copper. The thermal pad has a thermal conductivity greater than 175 W/(m·K). A thickness of the thermal pad may be less than about 150 The LED may include or consist essentially of a bare-die LED or a packaged LED.

In yet another aspect, embodiments of the invention feature an electronic device that includes or consists essentially of a substrate, a light-emitting diode (LED), a thermal pad, a backside thermal pad, and at least one thermal via. The substrate has first and second conductive traces on a first surface thereof. The first and second conductive traces are separated on the substrate by a gap therebetween and include or consist essentially of aluminum and/or copper. The LED has first and second distinct electrical contacts on a first LED surface thereof. The first and second contacts are attached and electrically coupled to, respectively, the first and second conductive traces via solder and/or an anisotropic conductive adhesive. At least a portion of the thermal pad is disposed within the gap between the first and second conductive traces. At least a portion of the thermal pad is disposed between the first surface of the substrate and the LED. The thermal pad is electrically isolated from the first and/or second electrical contacts. The thermal pad thermally couples the LED to the substrate without electrically coupling the LED to the substrate. The thermal pad includes or consists essentially of aluminum and/or copper. The backside thermal pad is disposed on a second surface of the substrate opposite the first surface. The at least one thermal via extends from the first surface of the substrate to the second surface of the substrate and thermally couples the thermal pad to the backside thermal pad. The backside thermal pad has a thermal conductivity greater than 150 W/(m·K), and the thermal via has a thermal resistance greater than about 0.05° K/W. The LED may include or consist essentially of a bare-die LED or a packaged LED. The backside thermal pad may include or consist essentially of aluminum and/or copper. A thickness of the thermal pad may be less than about 150 µm, and/or a thickness of the backside thermal pad may be less than about 150 µm.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Embodiments described herein that incorporate light-emitting diodes or other light-emitting elements may be implemented with other electronic components instead of or in addition to the light-emitting elements, unless otherwise indicated. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. As used herein, the terms "substantially," "approximately," and "about" mean±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
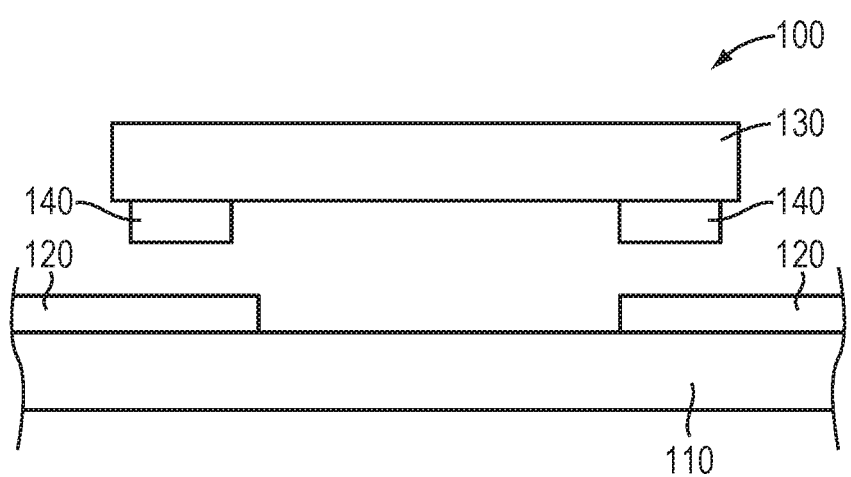
FIG. 1 is a schematic illustration of a semiconductor die in position to become bonded to a substrate.

FIG. 1 depicts a cross-sectional view of a portion of an assembly 100 that includes a substrate (e.g., a plastic and/or flexible substrate) 110 with conductive traces 120 disposed thereover. The assembly 100 features an exemplary LEE 130 having multiple contacts 140. The LEE 130 is positioned above conductive traces 120 prior to the die attach process, for use in various embodiments of the present invention. During the die attach process, the contacts 140 are each electrically coupled to a conductive trace 120. As mentioned above, conventional LEDs have contacts that provide power to the LED and that may also help extract heat from the LED. A key aspect of various embodiments of the present invention is the addition of an LEE thermal pad 150 to LEE 130, as shown in FIGS. 2A and 2B.

Figure 2A:
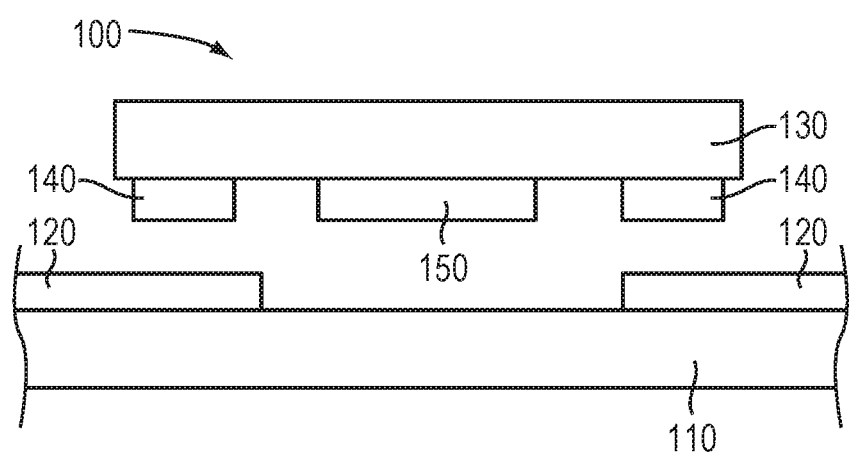
FIG. 2A is a schematic cross-sectional illustration of an LEE thermal pad disposed on an LEE in accordance with various embodiments of the invention.
Figure 2B:
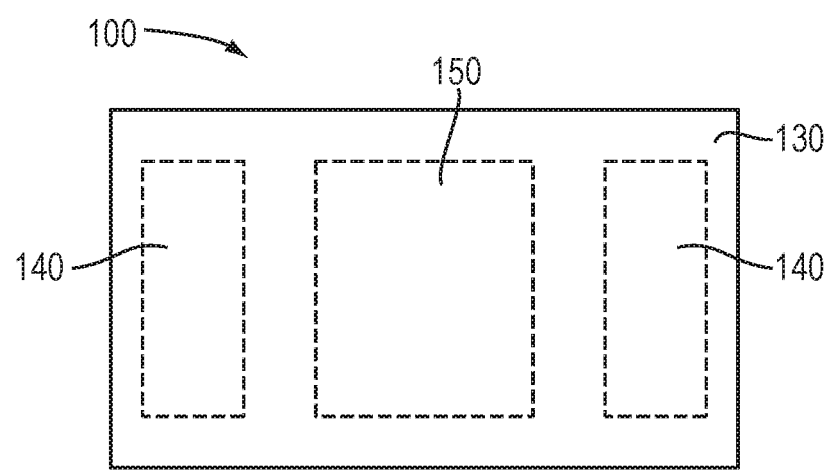
FIG. 2B is a schematic plan-view illustration of an LEE thermal pad disposed on an LEE in accordance with various embodiments of the invention.

FIGS. 2A and 2B are, respectively, cross-sectional and plan views of an LEE 130 having a thermal pad 150 formed and positioned between but not in contact with the LEE contacts 140; however, this is not a limitation of the present invention, and in other embodiments the LEE thermal pad 150 may be formed in other positions relative to LEE 130. The thickness of the LEE thermal pad 150 may be less than or approximately equal to the sum of the thicknesses of one contact 140 and the trace 120 to which it is bonded; thus, the LEE thermal pad 150 does not significantly interfere with the bonding of the contacts 140 to the traces 120. In one embodiment, the LEE thermal pad 150 may include or consist essentially of a thermally conductive material such as one or more metals, for example gold, silver, copper, aluminum, or the like; however, this is not a limitation of the present invention. In some embodiments, the LEE thermal pad 150 may include or consist essentially of one or more of the materials such as aluminum, copper, gold, silver, carbon, silicon, polysilicon, silicon carbide, polyester, polyimide, polyethylene, silicone, polyethylene terephthalate, polycrystalline (or "poly-") SiC, poly-AlN, SiC, AlN, and/or amorphous versions of these as well as other materials. In some embodiments, thermal pad 150 may have a thermal conductivity greater than about 1 W/(m·K) and preferably greater than about 10 W/(m·K). In some embodiments, thermal pad 150 may have a thermal conductivity in the range of about 50 W/(m·K) to about 600 W/(m·K) or higher.

In some embodiments, LEE thermal pad 150 may include or consist essentially of the same material as LEE contacts 140. In some embodiments, LEE thermal pad 150 may be formed in the same LEE fabrication step as LEE contacts 140. In some embodiments, LEE thermal pad 150 may have a thickness in the range of about 0.10 µm to about 20 µm. In some embodiments, LEE thermal pad 150 may have a thickness in the range of about 1 µm to about 5 µm. However, this is not a limitation of the present invention, and in other embodiments LEE thermal pad 150 includes or consist essentially a material different from LEE contact 140, and/or may be formed in a process step different from the step fabricating LEE contacts 140.

In some embodiments, LEE thermal pad 150 may have about the same thickness as contacts 140; however, this is not a limitation of the present invention, and in other embodiments LEE thermal pad 150 may advantageously have a thickness different from that of contacts 140. In some embodiments, all or a portion of the top surface of LEE thermal pad 150 and all or a portion of the top surface of LEE contacts 140 may be coplanar or substantially coplanar. For example, in some embodiments it may be desirable for LEE thermal pad 150 to have a thickness such that the LEE thermal pad 150 is thermally coupled to the substrate 110 after the LEE 130 has been attached to the substrate 110. In another embodiment, the thickness of LEE thermal pad 150 may advantageously have a thickness to permit thermal coupling with a heat-dissipating device such as a thermally conductive material or structure formed on substrate 110.

FIG. 2B shows contacts 140 and thermal pad 150 having rectangular shapes; however, this is not a limitation of the present invention, and in other embodiments contacts 140 and/or thermal pad 150 may have other shapes, for example a square, circle or any shape. In some embodiments, contacts 140 have a different shape than thermal pad 150. In some embodiments, each contact 140 is substantially the same shape and size, while in other embodiments each contact 140 may have a different shape and/or size. FIG. 2B shows one thermal pad 150 on LEE 130; however, this is not a limitation of the present invention, and in other embodiments LEE 130 may include more than one thermal pad 150.

Figure 2C:
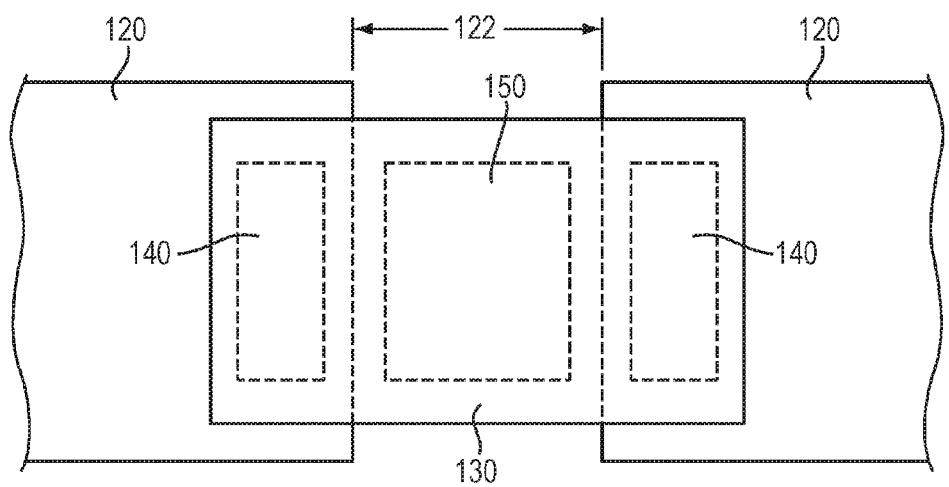
FIG. 2C is a schematic plan-view illustration of an LEE thermal pad in accordance with various embodiments of the invention.

FIG. 2C depicts an embodiment in which LEE thermal pad 150 has a width that is less than the gap spacing 122 between the conductive traces 120. In some embodiments the LEE thermal pad 150 includes or consists essentially of one or more electrically conductive materials (e.g., metals), and in such embodiments the LEE thermal pad 150 preferably does not cause an electrical short between adjacent conductive traces 120. In some embodiments, the LEE thermal pad 150 may overlap only one conductive trace 120. In embodiments in which the LEE thermal pad 150 is composed of an electrically conductive material, the width of the LEE thermal pad 150 is generally narrow enough to prevent the LEE thermal pad 150 from overlapping both conductive traces 120 and thereby electrically shorting the conductive traces 120.

Figure 2D:
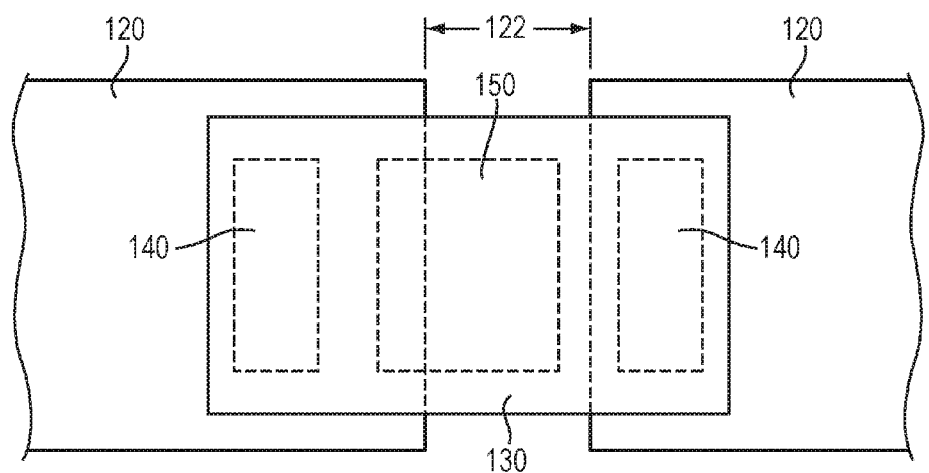
FIG. 2D is a schematic plan-view illustration of an LEE thermal pad having a width greater than an inter-trace gap spacing in accordance with various embodiments of the invention.

FIG. 2D depicts another embodiment in which LEE thermal pad 150 has a width that is greater than the gap spacing 122 between the conductive traces 120 and is thermally (and/or electrically) coupled to only one of the conductive traces 120. As shown, the center of LEE 130 is offset relative to the gap centerline, thus preventing the LEE thermal pad 150 from electrically shorting the conductive traces 120.

Figure 2E:
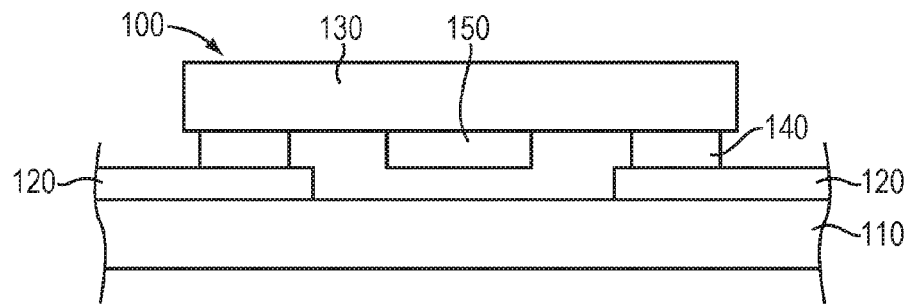
FIGS. 2E and 2F are schematic cross-sectional illustrations of LEEs incorporating LEE thermal pads in accordance with various embodiments of the invention.
Figure 2F:
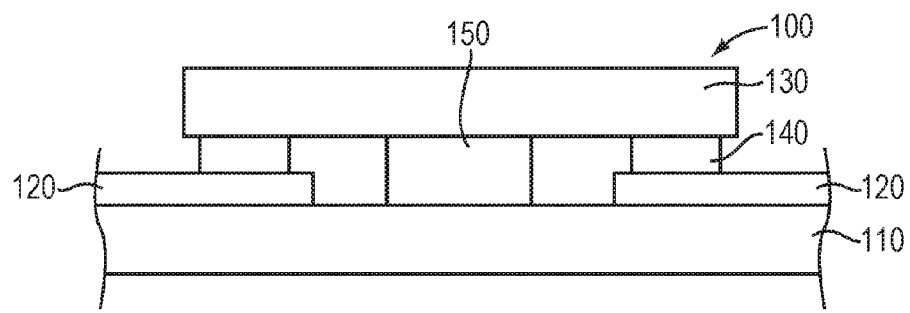

In some embodiments, LEE thermal pad 150 is not directly in contact with substrate 110, as shown in FIG. 2E, while in other embodiments LEE thermal pad 150 may be in contact with substrate 110, either directly or through one or more other materials, for example as shown in FIG. 2F. For example LEE thermal pad 150 may be thermally coupled to substrate 110 using an adhesive, epoxy, an anisotropic conductive adhesive, thermal grease, thermal gasket material or any other material that may aid in transfer of heat from LEE thermal pad 150 to substrate 110. In some embodiments, the attachment medium may be engineered and/or selected to have relatively low thermal resistance and thus provide increased heat transport from LEE thermal pad 150 to substrate 110. In some embodiments, LEE thermal pad 150 may be thermally coupled to substrate 110 using the same material used to attach and electrically couple contacts 140 to conductive traces 120.

Figure 2G:
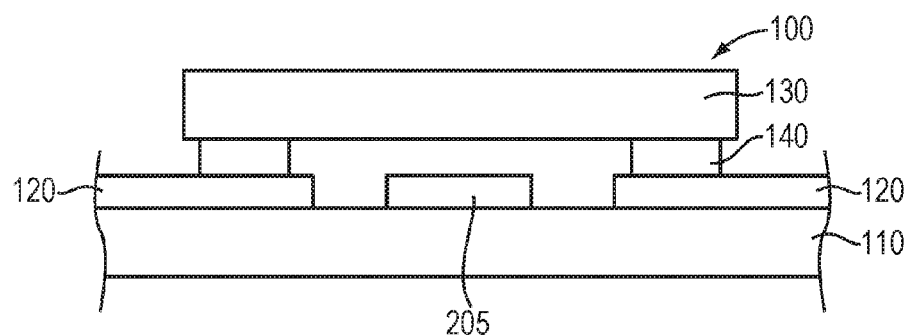
FIG. 2G is a schematic plan-view illustration of a substrate thermal pad disposed on a substrate in accordance with various embodiments of the invention.

In one embodiment, a thermal pad is formed on the substrate, identified as a substrate front side thermal pad 205 in FIG. 2G. As shown in FIG. 2G, in some embodiments substrate front side thermal pad 205 may be spaced away from LED 130, while in other embodiments it may be in contact with LED 130.

Figure 2H:
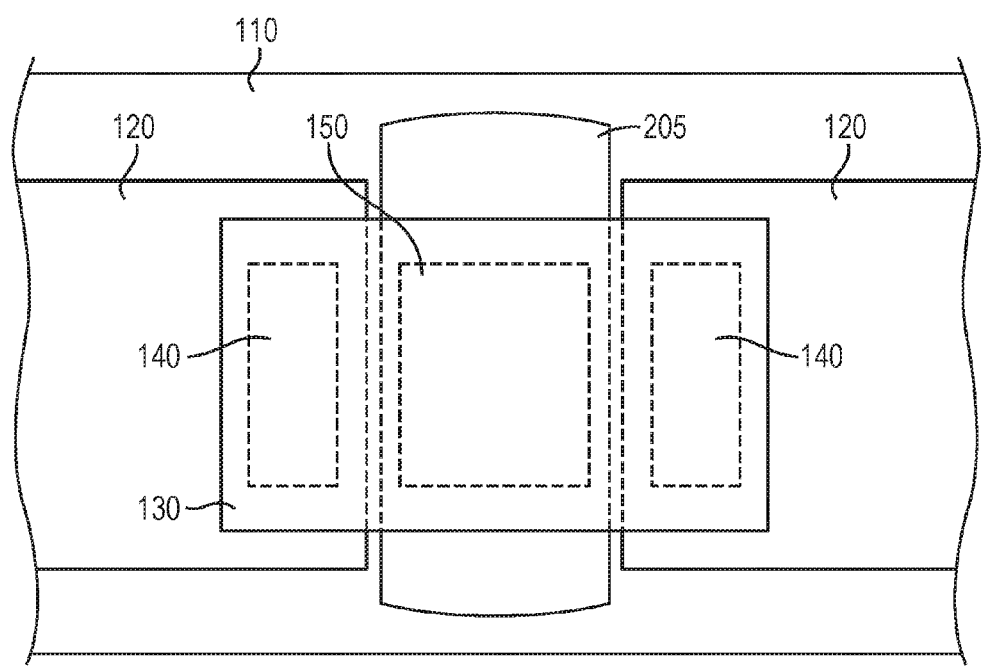
FIGS. 2H and 2I are, respectively, a schematic plan-view illustration and a schematic cross-sectional illustration of a lighting device incorporating a substrate thermal pad disposed on a substrate, thermally coupled to an LEE thermal pad, and located between but not in electrical contact with conductive traces, in accordance with various embodiments of the invention.
Figure 2I:
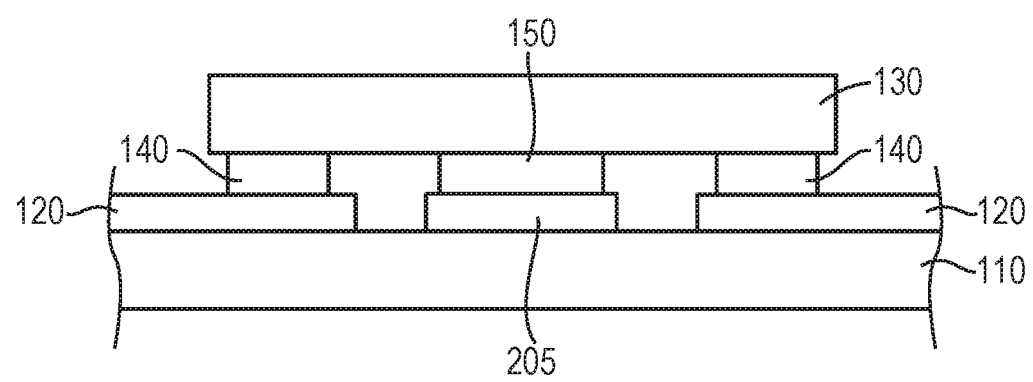

FIGS. 2H and 2I depict plan and cross-sectional views respectively of a front side substrate thermal pad 205 disposed on the front (top) side of substrate 110, thermally coupled to a LEE thermal pad 150, and located at least partially between but not in electrical contact with conductive traces 120 (for clarity, the details of the structure of LEE 130 and the attachment method of LEE 130 are not shown in FIG. 2H or 2I). Front side substrate thermal pad 205 may be formed into various shapes and be composed of various materials having relatively high thermal conductivity. In one embodiment, the material selected for front side substrate thermal pad 205 includes or consists essentially of the material used for the conductive traces 120. In some embodiments, front side substrate thermal pad 205 may include or consist essentially of the same material as conductive traces 120 and may be formed in the same step as (e.g., substantially simultaneously with) conductive traces 120 and may have a thickness in the range of about 0.10 μm to about 200 μm. In some embodiments, front side substrate thermal pad 205 may include or consist essentially of the same material as conductive traces 120 and may be formed in the same step as conductive traces 120 and may have a thickness in the range of about 10 μm to about 50 μm. In another embodiment, the material selected for front side substrate thermal pad 205 has relatively high thermal conductivity, and is thermally coupled with LEE thermal pad 150. In another embodiment, the material selected for front side substrate thermal pad 205 has relatively high thermal conductivity but is electrically isolating (for example, the material of front side substrate thermal pad 205 may have an electrical resistivity greater than approximately 100 ohm-cm, greater than approximately $1 \times 10^6$ ohm-cm, or even greater than approximately $1 \times 10^{10}$ ohm-cm), and in the absence of the LEE thermal pad 150, is thermally coupled with both the LEE 130 and the conductive traces 120. In another embodiment, the material selected for front side substrate thermal pad 205 has relatively high thermal conductivity but is electrically isolating, and is thermally coupled with one or both conductive traces 120 and the LEE thermal pad 150. In another embodiment, the material selected for front side substrate thermal pad 205 is an adhesive having relatively high thermal conductivity but is electrically isolating, and is thermally coupled with one or both conductive traces 120 and the LEE thermal pad 150. In another embodiment, the material selected for front side substrate thermal pad 205 is a non-adhesive material having relatively high thermal conductivity but is electrically isolating, and is thermally coupled with one or both conductive traces 120 and the LEE thermal pad 150. In another embodiment, front side substrate thermal pad 205 may be thermally coupled with additional heat-dissipating devices. Additional heat dissipating devices may be located on the same side of the substrate 110 as the LEE 130, or located on the opposite side of the substrate 110 and thermally coupled to the LEE thermal pad 130 or the front side substrate thermal pad 205, as described herein. In some embodiments, substrate front side thermal pad 205 may be larger than LEE thermal pad 150; for example, in some embodiments, front side thermal pad 205 may have an area at least 2 times that of LEE thermal pad 150, at least 5 times that of LEE thermal pad 150, or even more than 10 times that of LEE thermal pad 150.

Figure 3:
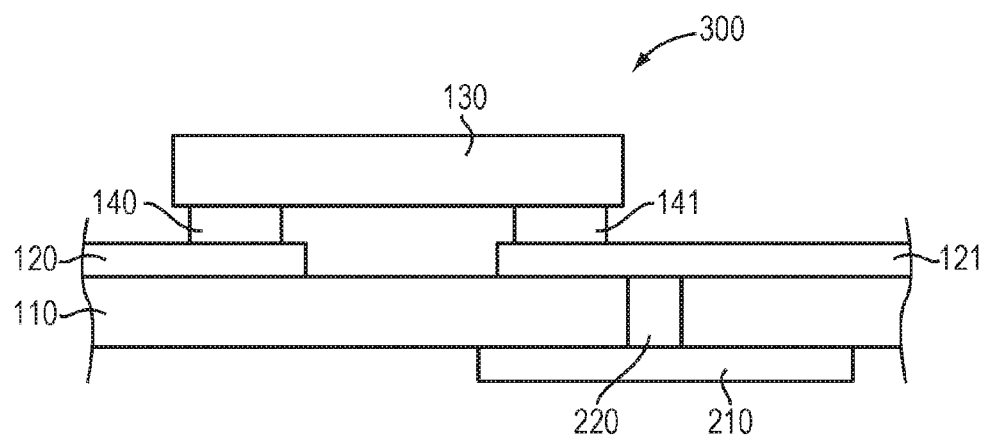
FIG. 3 is a schematic cross-sectional illustration of a thermal via and a substrate thermal pad in accordance with various embodiments of the invention.

FIG. 3 depicts an exemplary structure 300 in accordance with embodiments of the present invention, although alternative systems with similar functionality are also within the scope of the present invention. A key aspect of various embodiments of the present invention is a thermal via 220 and a back side substrate thermal pad 210, as shown in FIG. 3. As shown, LEE 130 is electrically coupled through LEE contacts 140, 141 to conductive traces 120, 121 formed over substrate 110. In some embodiments, thermal via 220 provides a pathway for heat extraction and/or heat spreading from LEE 130 and conductive trace 121 to back side substrate thermal pad 210 formed on the back side of substrate 110, i.e., the side of substrate 110 opposite the side over which is formed conductive traces 120, 121. Thus, in some embodiments the present invention provides a second pathway for heat removal from LEE 130. The first pathway is through conductive traces 120 and 121, as shown in, e.g., FIG. 2E. The second pathway is through thermal via 220 and back side substrate thermal pad 210. The thermal via 220 may extend through the thickness of substrate 110, and in some embodiments of the invention thermal via 220 may even intersect or extend partially through conductive trace 121 and/or back side substrate thermal pad 210. While FIG. 3 shows LEE 130 without a LEE thermal pad 150, this is not a limitation of the present invention, and in other embodiments LEE 130 may feature a thermal pad 150, as discussed herein. In some embodiments, thermal via 220 has an area in the range of about 0.1 mm² to about 10 mm². In some embodiments, thermal via 220 has an area in the range of about 0.25 mm² to about 4 mm². In some embodiments, thermal via 220 has a thermal conductivity of at least 1 W/(m·K). In some embodiments, thermal via 220 has a thermal conductivity of at least 10 W/(m·K). In some embodiments, thermal via 220 may have a thermal conductivity in the range of about 50 W/(m·K) to about 600 W/(m·K) or higher.

Figure 4A:
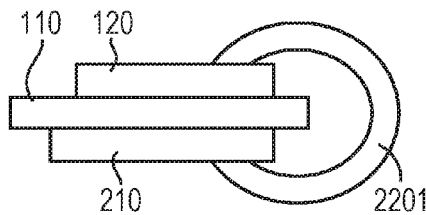
FIGS. 4A-4G are schematic illustrations of vias in accordance with various embodiments of the invention.
Figure 4B:
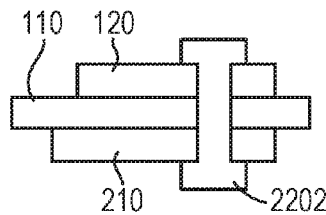
Figure 4C:
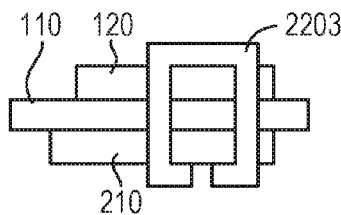
Figure 4D:
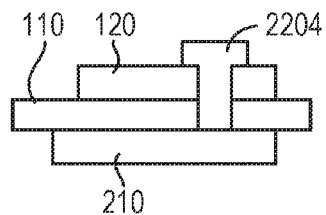
Figure 4E:
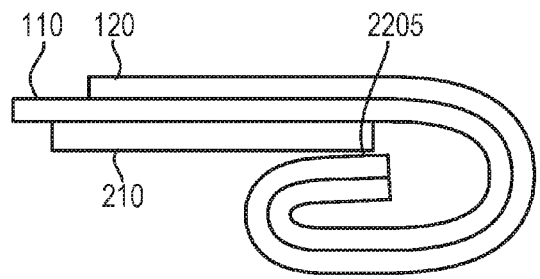
Figure 4F:
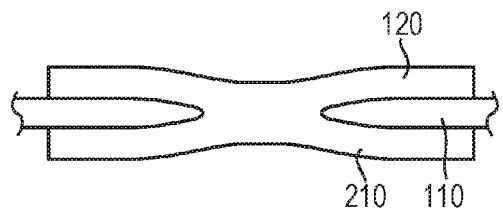
Figure 4G:
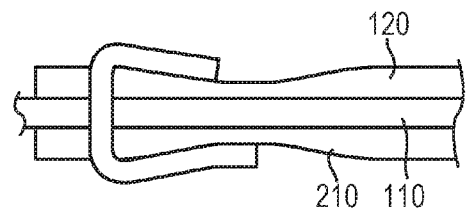

Electrical and thermal vias may have various configurations, as depicted in FIGS. 4A-4G. Via 220 may include or consist essentially of, e.g., a crimp-type via or a through-hole that is been filled or partially filled with electrically or thermally conductive material 2204 (FIG. 4D). In one embodiment, a crimp-type via includes or consists essentially of a portion of conductive trace 120 electrically coupled to a portion of back side substrate thermal pad 210, as shown in FIG. 4F. In one embodiment, the structure in FIG. 4F may be manufactured by applying pressure between the exposed surface of conductive trace 120 and, directly opposite it, the exposed surface of back side substrate thermal pad 210, causing substrate 110 to be deformed, resulting in a direct electrical connection between conductive trace 120 and back side substrate thermal pad 210. In one embodiment, a crimp-type via includes or consists essentially of one or more conductive members that pierce and electrically couple a portion of substrate 110, a portion of conductive trace 121 and a portion of back side substrate thermal pad 210, for example as shown in FIG. 4G. While FIG. 4G shows one conductive member forming the pierced crimp, this is not a limitation of the present invention and in other embodiments, more than one conductive member may be used to form the pierced crimp connection (via). In some embodiments, a via 220 may have other configurations, for example a clamp 2201 (FIG. 4A), a rivet 2202 (FIG. 4B), a staple 2203 (FIG. 4C), a wire, or the like. In some embodiments, the conductive traces 120, 121 and back side substrate thermal pad 210 are formed or printed and via 220 is formed as part of the forming or printing process. The means of forming thermal or electrical vias 220 between front side elements (conductive traces 120, 121, front side substrate thermal pads 205 and back side substrate thermal pad 210) is not a limitation of the present invention. In some embodiments, the connection between the back and front elements may be made by folding or rolling the end of the substrate 110, in order to put a conductor on one side of the substrate in contact with a conductor on the other side of the substrate in a region 2205, for example as shown in FIG. 4E.

In some embodiments, conductive elements may also be formed on the back of substrate 110 for the purpose of power conduction, as described in U.S. patent application Ser. No. 13/799,807, filed on Mar. 13, 2013, the entire disclosure of which is hereby incorporated herein by reference. In such embodiments, a via similar to thermal via 220 may be used to conduct electrical current from conductive elements on one side of the substrate to conductive elements on the opposite side of the substrate. In some embodiments, a via may conduct electrical current and heat, as described herein.

Disposed between front side elements and back side elements is substrate 110. Substrate 110 may include or consist essentially of a semicrystalline or amorphous material, e.g., polyethylene naphthalate (PEN), polyethylene terephthalate (PET), polycarbonate, polyethersulfone, polyester, polyimide, polyethylene and/or paper. Substrate 110 may include multiple layers, e.g., more than one flexible layers or a deformable layer over a rigid layer. Depending upon the desired application for which embodiments of the invention are utilized, substrate 110 may be substantially optically transparent, translucent, or opaque. For example, substrate 110 may exhibit a transmittance or a reflectivity greater than 70% for optical wavelengths ranging between approximately 400 nm and approximately 700 nm. In some embodiments, substrate 110 may exhibit a transmittance or a reflectivity of greater than 70% for one or more wavelengths emitted by LEE 130. In some embodiments, substrate 110 may be substantially insulating, and may have an electrical resistivity greater than approximately 100 ohm-cm, greater than approximately $1\times10^6$ ohm-cm, or even greater than approximately $1\times10^{10}$ ohm-cm. In some embodiments, substrate 110 may have a relatively high thermal conductivity. For example where substrate 110 includes or consists essentially of PET, the thermal conductivity may be in the range of about 0.10 to about 0.03 W m$^{-1}$ K$^{-1}$. In some embodiments, substrate 110 may have a thickness in the range of about 20 μm to about 1000 μm.

Conductive traces 120, 121, front side substrate thermal pad 205, and back side substrate thermal pad 210 may be formed via conventional deposition, photolithography, and etching processes, plating processes, lamination, lamination and patterning, evaporation sputtering, or the like, or may be formed using a variety of different printing processes. For example, traces 120, 121, front side substrate thermal pad 205, and back side substrate thermal pad 210 may be formed via screen printing, flexographic printing, ink-jet printing, and/or gravure printing. Conductive traces 120, 121, front side substrate thermal pad 205, and back side substrate thermal pad 210 may include or consist essentially of a conductive material (e.g., an ink or a metal, metal film, or other conductive materials, or the like), which may include one or more elements such as silver, gold, aluminum, chromium, copper, silver ink, copper ink, carbon ink, and/or carbon. In one embodiment, conductive traces 120 include or consist essentially of copper, for example to enable a solder process of die attach, while LEE thermal pad 150 includes or consists essentially of gold. In one embodiment, conductive traces 120 include or consist essentially of aluminum.

In some embodiments, conductive traces 120, 121, front side substrate thermal pad 205, and back side substrate thermal pad 210 may have a thickness in the range of about 50 nm to about 1000 μm. In some embodiments, conductive traces 120, 121, front side substrate thermal pad 205, and back side substrate thermal pad 210 may have a thickness in the range of about 10 μm to about 150 μm, as such small thicknesses may substantially retain the flexibility of flexible substrates 110 while advantageously providing heat dissipation. In some embodiments, conductive traces 120, 121, front side substrate thermal pad 205, and back side substrate thermal pad 210 may have a maximum thickness of about 150 μm, in order to retain substrate flexibility. In some embodiments, the thickness of traces 120, 121 may be determined by the current to be carried thereby. While the thickness of one or more of traces 120, 121, front side substrate thermal pad 205, and back side substrate thermal pad 210 may vary, the thickness is generally substantially uniform along the length of the trace to simplify processing. However, this is not a limitation of the present invention and in other embodiments the thickness and/or material of traces 120, 121, front side substrate thermal pad 205, and back side substrate thermal pad 210 may vary. In some embodiments, all or a portion of conductive traces 120, 121, front side substrate thermal pad 205 and back side substrate thermal pad 210 may be covered or encapsulated. In some embodiments, a layer of material, for example electrically insulating material, may be formed over all or a portion of traces 120, 121, front side substrate thermal pad 205, and back side substrate thermal pad 210. Such a material may include, e.g., a sheet of material such as used for substrate 110, a printed layer, for example using screen, ink jet, stencil or other printing means, a laminated layer, or the like. Such a printed layer may include, for example, an ink, a plastic and oxide, or the like. The covering material and/or the method by which it is applied are not a limitation of the present invention.

In some embodiments, front side substrate thermal pad 205 and back side substrate thermal pad 210 may include or consist essentially of the same material as conductive traces 120, 121; however, this is not a limitation of the present invention, and in other embodiments front side substrate thermal pad 205 and back side substrate thermal pad 210 include or consist essentially of a material different from conductive traces 120, 121.

In some embodiments, front side substrate thermal pad 205 and back side substrate thermal pad 210 may have about the same thickness as conductive traces 120, 121; however, this is not a limitation of the present invention, and in other embodiments front side substrate thermal pad 205 and back side substrate thermal pad 210 may advantageously have a thickness different from that of conductive traces 120, 121. For example, in some embodiments it may be desirable to have a certain trace 120, 121 thickness and/or material for bonding of an LEE to conductive traces 120, 121, while having a different material and or thickness for front side substrate thermal pad 205 and back side substrate thermal pad 210.

LEE 130 may be electrically coupled to conductive traces 120, 121 and/or mechanically coupled to conductive traces 120, 121 and/or substrate 110 using a variety of means, for example soldering, wire bonding, conductive adhesive, anisotropic conductive adhesive (ACA) or the like. The method of electrical and/or mechanical coupling or bonding is not a limitation of the present invention. However, the method of attachment may impact the flow of heat out of LEE 130.

Figure 5A:
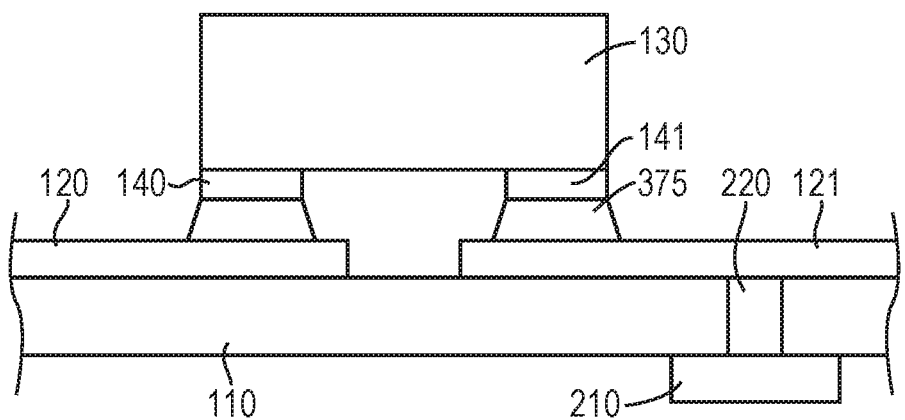
FIG. 5A is a schematic cross-sectional illustration of a lighting device incorporating a packaged LEE in accordance with various embodiments of the invention.
Figure 5B:
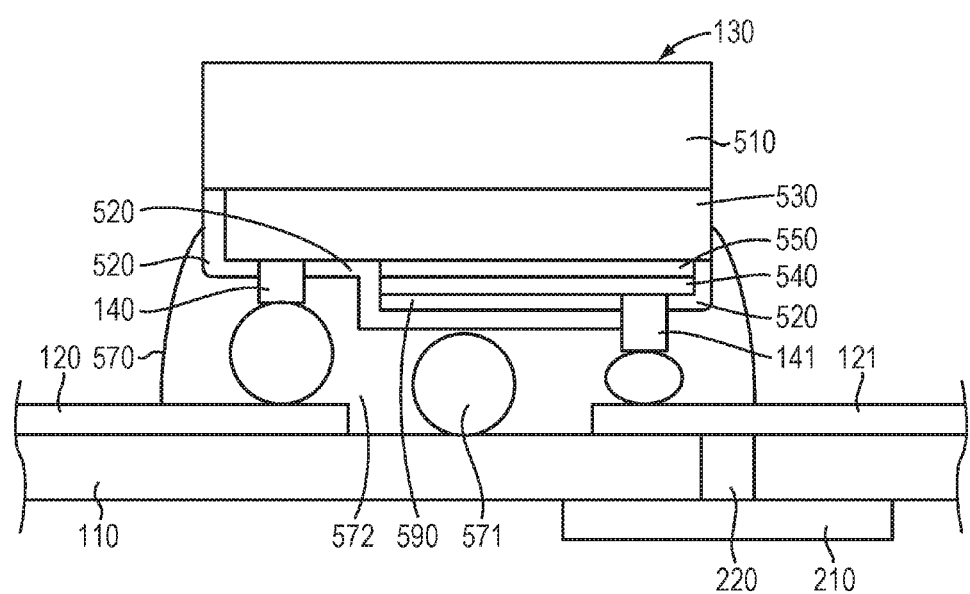
FIG. 5B is a schematic cross-section illustration of a lighting device incorporating a bare-die LEE in accordance with various embodiments of the invention.

FIG. 5A shows one embodiment of the present invention in which LEE 130 is electrically coupled and mechanically attached to conductive traces 120, 121 using a bonding material 375. In some embodiments, bonding material 375 includes or consists essentially of a solder. In some embodiments, bonding material 375 includes or consists essentially of a conductive adhesive, e.g., an isotropic conductive adhesive or an ACA. FIG. 5A also shows an embodiment in which back side substrate thermal pad 210 is relatively thicker than conductive trace 121. In FIG. 5A, LEE 130 includes or consists essentially of a packaged LEE 130 (i.e., a bare LEE die disposed within a package, where contacts 140, 141 are disposed and/or extend out of the package and are electrically coupled to the die within the package); however this is not a limitation of the present invention, and in other embodiments LEE 130 may include or consist essentially of a bare semiconductor die LEE 130, as shown in FIG. 5B. In some embodiments, back side substrate thermal pad 210 has a thickness in the range of about 0.5 µm to about 200 µm. In some embodiments, back side substrate thermal pad 210 has a thickness in the range of about 10 µm to about 100 µm.

In some embodiments, thermal via 220 may have an area (e.g., in a cross-section substantially parallel to a surface of substrate 110 and/or conductive trace 120) in the range of about 0.0001 cm$^2$ to about 1 cm$^2$. In some embodiments, thermal via 220 may have a thickness substantially the same as that of substrate 110. In some embodiments, thermal via 220 may have a thickness in the range of about 10 µm to about 500 µm.

In some embodiments, thermal via 220 may have a thermal resistance in the range of about 0.05° K/W to about 10° K/W. In one embodiment, substrate 110 has a thickness of about 38 µm, thermal via 220 has an area of about 0.01 cm$^2$, and thermal via includes or consists essentially of aluminum having a thermal conductivity of about 235 W/(m·K), resulting in the thermal via 220 having a thermal resistance of about 1.62° K/W. In one embodiment, substrate 110 has a thickness of about 38 µm, thermal via 220 has an area of about 0.04 cm$^2$, and thermal via includes or consists essentially of aluminum having a thermal conductivity of about 235 W/(m·K), resulting in the thermal via having a thermal resistance of about 0.4° K/W. In one embodiment, substrate 110 has a thickness of about 38 µm, thermal via 220 has an area of about 0.04 cm$^2$, and thermal via includes or consists essentially of silver having a thermal conductivity of about 406 W/(m·K), resulting in the thermal via having a thermal resistance of about 0.23° K/W. In one embodiment, substrate 110 has a thickness of about 125 µm, thermal via 220 has an area of about 0.01 cm$^2$ and thermal via includes or consists essentially of aluminum having a thermal conductivity of about 235 W/(m·K), resulting in the thermal via having a thermal resistance of about 5.3° K/W.

FIG. 5B shows one embodiment of the present invention in which LEE 130 includes or consists essentially of a bare semiconductor die. In this embodiment, LEE 130 is electrically coupled to conductive traces 120, 121 and mechanically attached to conductive traces 120, 121 and a portion of substrate 110 using a conductive adhesive 570. In some embodiments conductive adhesive 570 includes or consists essentially of an ACA. In some embodiments, ACA 570 includes or consists essentially of an adhesive component 572 in which is infused conductive particles 571. ACA 570 enables electrical interconnection in one direction (e.g., vertically between a device contacts 140, 141 and conductive traces 120, 121, respectively) through conductive particles 571, but prevents it in other directions (e.g., horizontally between contacts 140, 141 on LEE 130 or between conductive traces 120, 121 on a substrate 110). Various ACAs are pressure-activated, and in some embodiments they may require provision of "stud bumps" or other metallic projections on the surface to which the LEE 130 is to be bonded or on the LEE contacts 140, 141 in order to create the anisotropic electrical conductivity and promote adhesion; however, this is not a limitation of the present invention and in other embodiments stud bumps need not be required, as described in the '121 patent. In some embodiments, conductive particles 571 include or consist essentially of spheres of a conductive material or of an insulating material coated with a conductive material (such as metal or a conductive material coated with an insulating material). In some embodiments, conductive particles 571 may be substantially spherical, while in other embodiments conductive particles 571 may have other shapes, for example a more planar flake shape or a three-dimensional flake shape. In some embodiments, pressure and heat are applied to activate and cure the ACA. FIG. 5B depicts the use of pressure-activated ACA 570 to connect a LEE 130 to a substrate 110. As shown, the LEE 130 having multiple contacts 140, 141 has been adhered and electrically connected to a substrate 110 via the ACA 570. As shown, the conductive particles 571 provide electrical connectivity between each contact 140, 141 and its respective trace 120, 121, but are dispersed at a sufficiently low density such that an electrical connection is not formed between the contacts 140, 141 and/or the traces 120, 121.

In other embodiments LEE 130 may be electrically coupled and mechanically attached to conductive traces 120, 121 and optionally substrate 110 using a conductive adhesive (e.g., an isotropic conductive adhesive) or a combination of conductive and non-conductive adhesives.

Referring to FIG. 5B, in some embodiments LEE 130 includes a substrate 510 with one or more semiconductor layers 530, 540, 550 disposed thereover. LEE 130 may also include an optional insulating layer 520 and/or an optional mirror layer 590. Contacts 140 and 141 make contact to semiconductor layers 530 and 540 respectively. In this exemplary embodiment, LEE 130 represents a light-emitting device such as a LED or a laser, but other embodiments of the invention feature one or more semiconductor dies with different or additional functionality, e.g., processors, sensors, detectors, and the like. Non-LED dies may or may not be bonded as described herein, and may have contact geometries differing from those of the LEDs; moreover, they may or may not have semiconductor layers disposed over a flexible substrate as discussed below.

Referring to FIG. 5B, in one embodiment LEE 130 includes a first semiconductor layer 530, an active layer 550, and a second semiconductor layer 540. In this example, the first semiconductor layer 530 may be an n-type semiconductor layer, and the second semiconductor layer 540 may be a p-type semiconductor layer. The first semiconductor layer 530 may be configured to supply electrons to the active layer 550, and the second semiconductor layer 540 may be configured to supply holes to the active layer 550. Electrons and holes may be coupled in the active layer 550, and light may be emitted from the active layer 550 as a result of or in response to the coupling. However, this embodiment is not a limitation of the present invention, and in other embodiments the semiconductor layers may be interchanged. In this embodiment, contact 140 is electrically coupled to the n-type semiconductor layer 530 while contact 141 is electrically coupled to the p-type semiconductor layer 540. However, this is not a limitation of the present invention, and in other embodiments the connections may be reversed. FIG. 5B shows one contact each to the p-type and n-type semiconductor layers; however, this is not a limitation of the present invention, and other embodiments may have more than one contact to either or both semiconductor layers.

As shown in FIG. 5B, in preferred embodiments LEE 130 is patterned and etched (e.g., via conventional photolithography and etch processes) such that a portion of layer 530 is exposed in order to facilitate electrical contact to layer 530 and layer 540 on the same side of LEE 130 (and without, for example, the need to make contact to layer 530 through substrate 510 or to make contact to layer 530 with a shunt electrically connecting a contact pad over layer 540 to layer 530). One or more portions of layers 540, 550 are removed (or never formed) in order to expose a portion of layer 530. In order to facilitate electrical contact to LEE 130, discrete electrical contacts 140, 141 are formed on layers 530, 540, respectively. Electrical contacts 140, 141 may each include or consist essentially of a suitable conductive material, e.g., one or more metals or metal alloys conductive oxides, or other suitable conductive materials. While FIG. 5B shows contacts 140 and 141 as non-coplanar, this is not a limitation of the present invention and in other embodiments contacts 140 and 141 (at least the outer surfaces thereof) are coplanar or substantially coplanar.

Substrate 510 may include or consist essentially of one or more semiconductor materials, e.g., silicon, GaAs, InP, GaN, and may be doped or substantially undoped (e.g., not intentionally doped). In some embodiments, substrate 510 includes or consists essentially of sapphire or silicon carbide. Substrate 510 may be substantially transparent to a wavelength of light emitted by the LEE 130. As shown for a light-emitting device, semiconductor layers 530, 540, 550 may include first and second doped layers 530, 540, which preferably are doped with opposite polarities (i.e., one n-type doped and the other p-type doped). One or more light-emitting layers 550, e.g., one or more quantum wells, may be disposed between layers 530, 540. Each of layers 530, 540, 550 may include or consist essentially of one or more semiconductor materials, e.g., silicon, InAs, AlAs, GaAs, InP, AlP, GaP, InSb, GaSb, AlSb, GaN, AlN, InN, and/or mixtures and alloys (e.g., ternary or quaternary, etc. alloys) thereof. In preferred embodiments, LEE 130 is an inorganic, rather than a polymeric or organic, device. As referred to herein, LEEs may be packaged or unpackaged unless specifically indicated (e.g., a bare-die LEE is an unpackaged semiconductor die). In some embodiments, substantially all or a portion of substrate 510 is removed prior to or after the bonding of LEE 130 described below. Such removal may be performed by, e.g., chemical etching, laser lift-off, mechanical grinding and/or chemical-mechanical polishing or the like. In some embodiments, all or a portion of substrate 510 may be removed and a second substrate—e.g., one that is transparent to or reflective of a wavelength of light emitted by LEE 130—is attached to substrate 510 or semiconductor layers 520 prior to or after the bonding of LEE 130 as described below. In some embodiments, substrate 510 includes or consists essentially of silicon, and all or a portion of silicon substrate 510 may be removed prior to or after the bonding of LEE 130 described below. Such removal may be performed by, e.g., chemical etching, laser lift off, mechanical grinding and/or chemical-mechanical polishing or the like.

In preferred embodiments the conductive trace 120, 121 coupled to the thermal via 220 is coupled to the contact 140, 141 of LEE 130 that has the least thermal resistance to the heat-generating region in LEE 130. For example, FIG. 5B shows contact 141, which is attached to the p-type semiconductor layer 540, being coupled to thermal via 220. In some embodiments, the p-type semiconductor layer 540 is closest to the surface of LEE 130 and contact 141 provides the lowest thermal resistance to conductive trace 121. However, this is not a limitation of the present invention, and in other embodiments either contact may be thermally coupled to thermal via 220. While FIG. 5B shows a bare-die LEE 130, ACA 570 may also be used with packaged LEEs 130.

The size and shape of contacts 140, 141 of LEE 130 may be designed to reduce thermal resistance between LEE 130 and heat-dissipating elements, including, for example, conductive traces 120, 121, front side substrate thermal pads 205, thermal via 220, and back side substrate thermal pad 210.

Figure 6B:
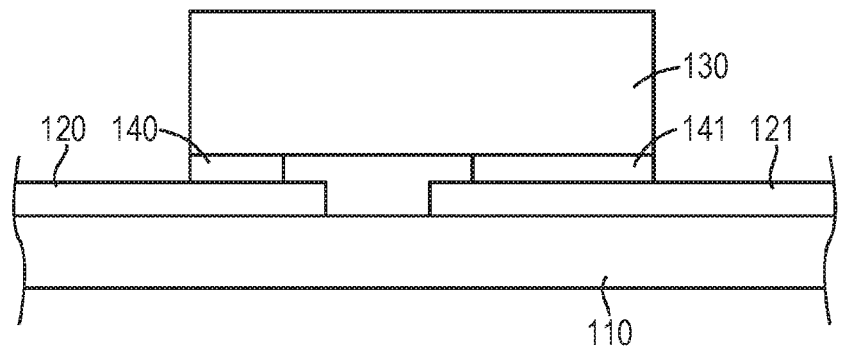
FIGS. 6A and 6B are a schematic plan-view and cross-sectional illustrations of an LEE in accordance with various embodiments of the invention.
Figure 6A:
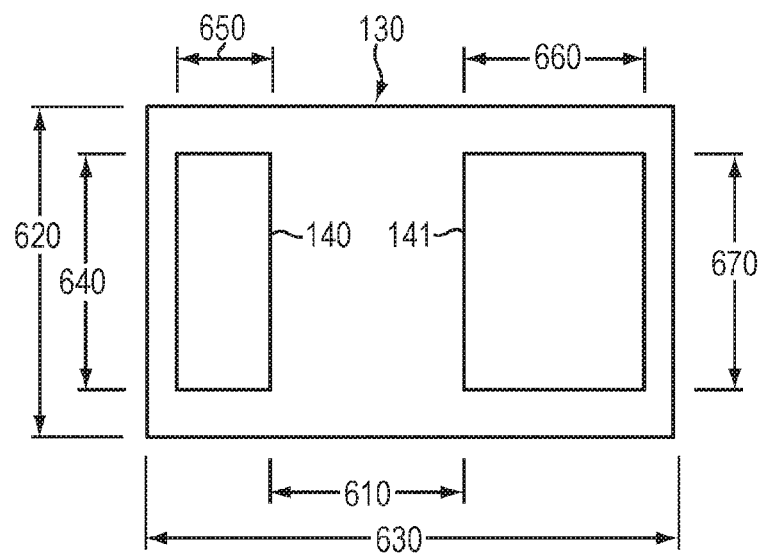

In one embodiment of the present invention, an asymmetric contact design may be used to enhance heat transfer out of LEE 130. FIGS. 6A and 6B respectively depict a plan view and cross-sectional view of an LEE 130 that features asymmetric contact sizes. In FIGS. 6A and 6B, p-contact 141 is relatively larger than n-contact 140; however, this is not a limitation of the present invention, and in other embodiments, p-contact 141 is relatively smaller than the n-contact 140. In some embodiments, a spacing 610 between contact 140 and 141 may be advantageously controlled. For example, in embodiments in which LEE 130 is electrically coupled using ACA it may be desirable to set a minimum dimension 610, for example to be at least as large as gap width 122 as shown in FIG. 2C. In some embodiments, it may be desirable to maintain a certain die area while maximizing gap width 122. In such embodiments, die width 620 may be reduced while die length 630 is increased. FIG. 6A shows contact 140 having a width 640 and a length 650 and contact 141 having a width 670 and a length 660. FIG. 6A shows width 670 as equal or substantially equal to width 640; however, this is not a limitation of the present invention, and in other embodiments width 670 may not be the same as width 640. Table 1 lists dimensions in microns for several exemplary embodiments of LEE 130 of FIG. 6A. These dimensions are exemplary and are not limitations of the present invention.

TABLE 1

| | Dimension | | | | | |
|---|---|---|---|---|---|---|
| Example | 630 | 620 | 640 | 650 | 670 | 660 |
| 1 | 300 | 200 | 180 | 30 | 180 | 30 |
| 2 | 300 | 200 | 180 | 30 | 180 | 70 |
| 3 | 600 | 200 | 180 | 50 | 180 | 250 |
| 4 | 600 | 200 | 180 | 100 | 180 | 250 |

In some embodiments the area of one contact, for example contact 141, may be in the range of about 1.25 times to about 10 times larger than the area of the other contact, here contact 140. In some embodiments, the area of one contact, for example contact 141, may be in the range of about 2 times to about 5 times larger than the area of the other contact, here contact 140.

In some embodiments, the width of conductive trace 121 is approximately equal to the width of contact 141 or larger, to enhance thermal conduction from the LEE 130. In another embodiment, conductive trace 121 may be narrower than the width of contact 141. In some embodiments, LEE 130 includes an asymmetrically larger contact 141 placed in an offset position on the conductive traces 121, to increase the area for heat transfer from LEE 130 to conductive trace 121. In another embodiment, the gap between the conductive traces 120, 121 is minimized to permit relatively larger contact area between contacts 140, 141 and conductive traces 120, 121. FIG. 6B depicts a cross-sectional view of LEE 130 having asymmetric p-contact 141, disposed over conductive trace 121 in an offset configuration. In some embodiments, the center of spacing 610 may be offset from the center of LEE 130 by an amount up to about 5% of a length 630 of LEE 130. In some embodiments, the center of spacing 610 may be offset from the center of LEE 130 by an amount up to about 20% of the length 630 of LEE 130. In some embodiments, the center of spacing 610 may be offset from the center of LEE 130 by an amount up to about 40% of the length 630 of LEE 130.

Figure 7A:
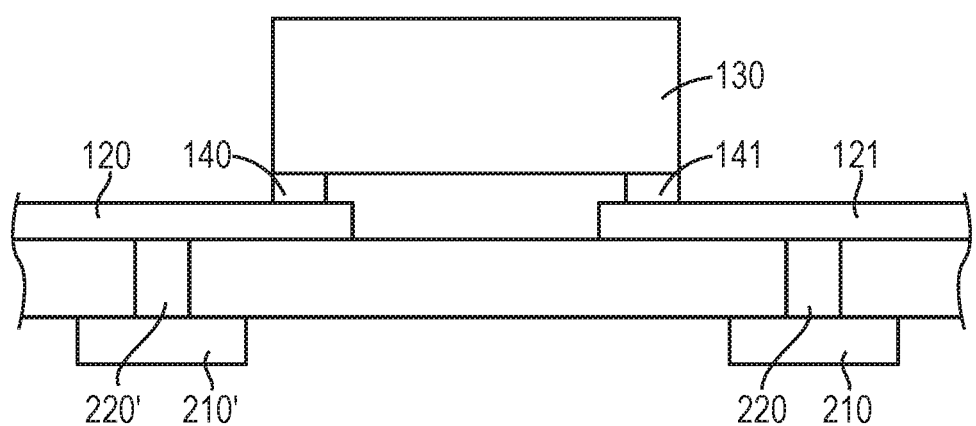
FIGS. 7A and 7B are schematic cross-sectional illustrations of lighting devices incorporating LEEs in accordance with various embodiments of the invention.

While FIGS. 3, 5A, and 5B show one thermal via 220 per back side substrate thermal pad 210, this is not a limitation of the present invention, and in other embodiments a back side substrate thermal pad 210 may be associated with more than one thermal via. Referring to FIG. 7A, some embodiments may feature multiple thermal vias and multiple substrate thermal pads. For example, FIG. 7A shows an embodiment with separate thermal vias 220, 220' and substrate thermal pads 210, 210' for each contact 120, 121 respectively (for clarity, the details of the structure of LEE 130 and the attachment method of LEE 130 are not shown in FIG. 7A). As shown in FIG. 7A, thermal vias 220 and 220' are not electrically coupled to each other, nor are substrate thermal pads 210 and 210' electrically coupled to each other.

Figure 7B:
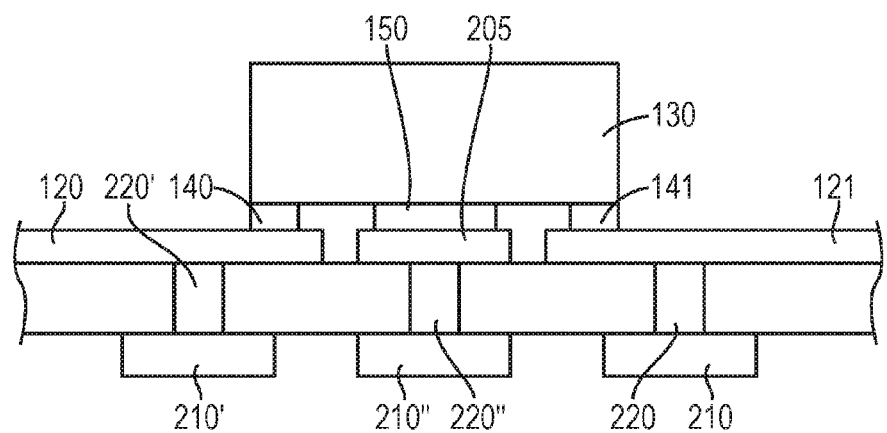
Figure 7C:
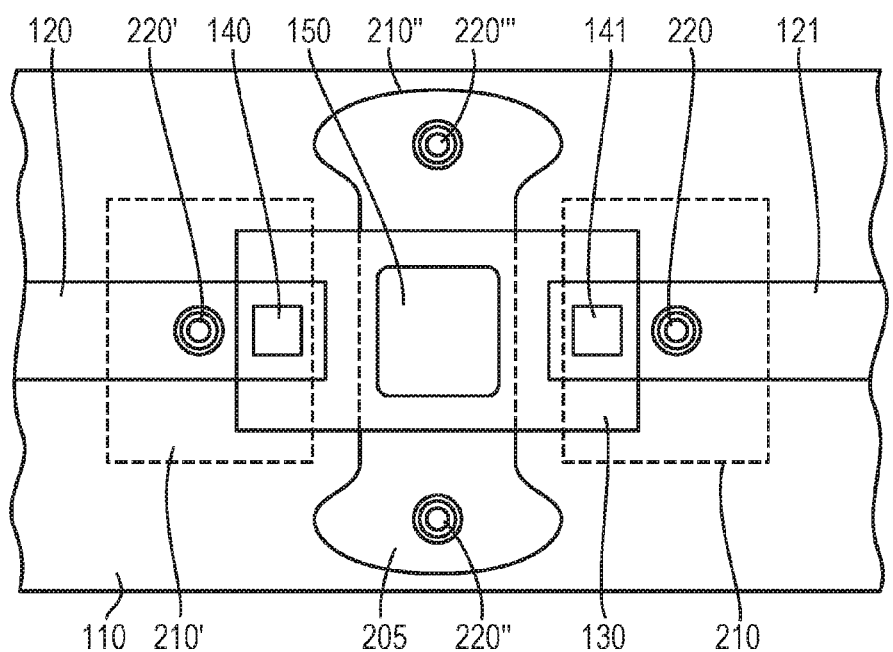
FIG. 7C is a schematic plan-view illustration of a lighting device incorporating an LEE in accordance with various embodiments of the invention.

Some embodiments may include more than two substrate thermal pads 210 (one or more being disposed on each of the front or back or both sides of the substrate 110) coupled with the contacts 120, 121 and LEE thermal pad 150. For example, FIGS. 7B and 7C show a structure with three back substrate thermal pads and one front substrate thermal pad. FIGS. 7B and 7C respectively show cross-sectional and plan views of an embodiment with separate thermal vias 220, 220' and back side substrate thermal pads 210', 210 for each contact 120, 121 respectively, and separate thermal vias 220", 220"' coupling front side substrate thermal pad 205 with back side substrate thermal pad 210". In one embodiment, conductive traces 120, 121 include or consist essentially of the same material as front side substrate thermal pad 205 and back side substrate thermal pads 210, 210', and 210". However, this is not a limitation of the present invention, and in other embodiments conductive traces 120, 121, front side substrate thermal pad 205 and back side substrate thermal pads 210, 210', and 210" may include or consist essentially of different materials. In one embodiment, conductive traces 120, 121 include or consist essentially of copper, for example to enable use of solder to attach contacts 140, 141, while back side substrate thermal pad 210 (and if present 210' and 210") includes or consists essentially of aluminum.

Figure 8:
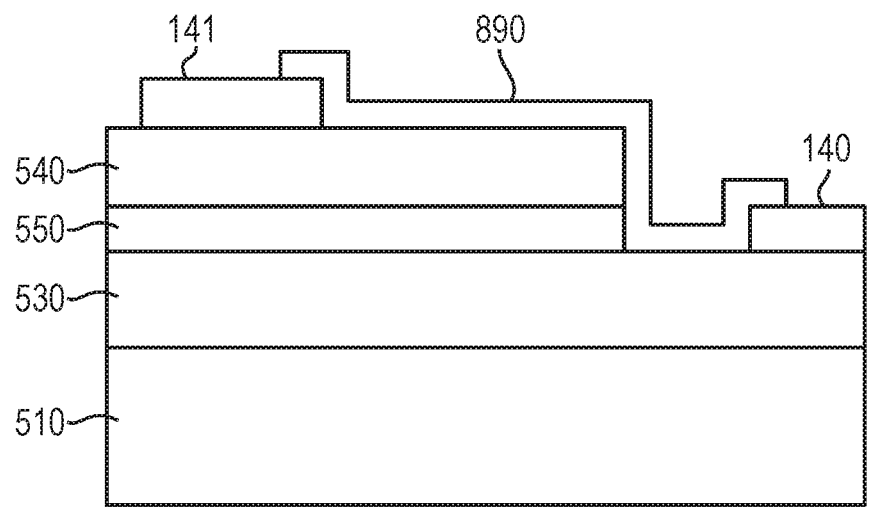
FIG. 8 is a schematic cross-sectional illustration of an LEE in accordance with various embodiments of the invention.

Elements of the LEE 130 other than the contacts 140, 141 may also be utilized for heat removal. A reflector 890 shown in FIG. 8 may be disposed between or above portions of contacts 140, 141 and over portions or substantially all of layer 540. In some embodiments reflector 890 is reflective to at least some or all wavelengths of light emitted by LEE 130 and may include or consist essentially of any of various materials. In one embodiment, reflector 890 is non-conductive (i.e., electrically insulating). In some embodiments, reflector 890 may be a Bragg reflector. In some embodiments, reflector 890 may include or consist essentially of one or more conductive materials, e.g., metals such as silver, gold, platinum, etc. Instead of or in addition to reflector 890, exposed surfaces of LEE 130 except for contacts 140, 141 may optionally be coated with one or more layers of an electrically insulating material, e.g., a nitride such as silicon nitride or an oxide such as silicon dioxide. In some embodiments, contacts 140, 141 include a bond portion, e.g. a bond pad, for connection to conductive traces 120, 121 and a current-spreading portion for providing more uniform current through LEE 130, and in some embodiments, one or more layers of an insulating material are formed over all or portions of LEE 130 except for the bond portions of contacts 140, 141. FIG. 5B shows a schematic of LEE 130 with insulating material 520 covering substantially the entire surface of LEE 130 except for contacts 140, 141. Insulating material 520 may include or consist essentially of, for example, polyimide, silicon nitride, silicon oxide and/or silicon dioxide. Such insulating material 520 may cover all or portions of the top and sides of LEE 130 as well as portions of the top and sides of layers 530, 540, and 550. Insulating material 520 may act to prevent shorting between reflector 890 and/or portions of semiconductor layers 530, 540, and 550 and conductive traces 120, 121, or both during and/or after the bonding of the contacts to the conductive traces.

In some embodiments, reflector 890 of LEE 130 may be used as a heat-dissipating device. In some embodiments, it may be advantageous to eliminate the LEE thermal pad 150 and instead use an electrically non-conductive material having a relatively high thermal conductivity to conduct heat from the reflector 890 to heat-dissipating elements such as the conductive traces 120, 121, the front side substrate thermal pad 205, or the substrate 110 itself or to ambient. In other embodiments, the reflector 890 may optionally be covered by a thermally conductive oxide layer.

Figure 9:
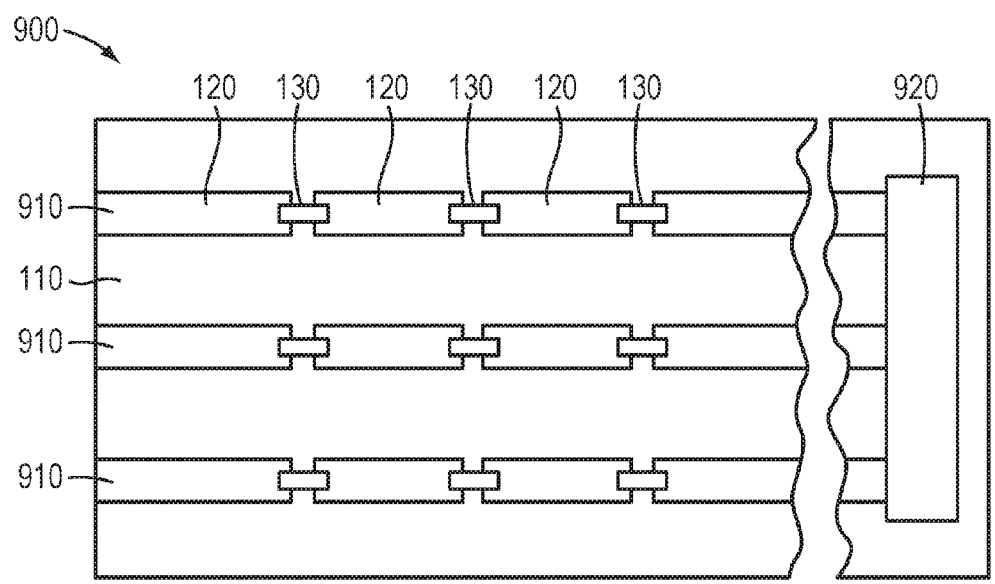
FIG. 9 is a schematic plan-view illustration of an electronic device featuring multiple semiconductor dies adhered to a substrate, in accordance with various embodiments of the invention.

FIG. 9 depicts an electronic device 900 featuring an array of LEEs 130 each adhered between pairs of conductive traces 120 as described above. As shown, electronic device 900 includes three serially-connected strings 910 of LEEs 130. Electronic device 900 also includes circuitry 920 electrically connected to one or more of the strings 910. The circuitry 920 may include or consist essentially of portions of (in the case, for example, of a distributed power supply/driver) or substantially all of drive circuitry, sensors, control circuitry, dimming circuitry, and or power-supply circuitry or the like, and may also be adhered (e.g., via an adhesive) or otherwise attached to substrate 110. Circuitry 920 may even be disposed on a circuit board (e.g., a printed circuit board) that itself may be mechanically and/or electrically attached to substrate 110. In other embodiments, circuitry 920 is separate from substrate 110. While FIG. 9 depicts the LEE 130 serially connected in strings 910, and strings 910 connected or connectable in parallel, other LEE-interconnection schemes are possible and within the scope of the invention.

In some embodiments, electronic device 900 may be fabricated on a flexible substrate 110. In some embodiments, electronic device may be formed in a roll-to-roll process, in which a sheet of the flexible substrate material travels through different processing stations. Such roll-to-roll processing may, for example, include the formation of conductive traces 120, dispensing of the adhesive or ACA, the placement of LEEs 130, and the curing of the adhesive, as well as for the bonding of any additional components and/or formation of one or more phosphor materials at least partially surrounding LEEs 130. In addition, electronic device 900 may also include other passive and/or active electronic devices attached to substrate 110, including, e.g., sensors, antennas, resistors, inductors, capacitors, thin-film batteries, transistors and/or integrated circuits. Such other passive and/or active electronic devices may be electrically coupled to conductive traces 120 or LEEs 130 with an adhesive, an ACA or by other means. Roll-to-roll processing may also use other means for attachment and electrical coupling of LEE 130 and/or other components, for example solder or wire bonding. The means for attachment and electrical coupling of LEE 130 and/or other components is not a limitation of the present invention.

Figures 10A, 10B:
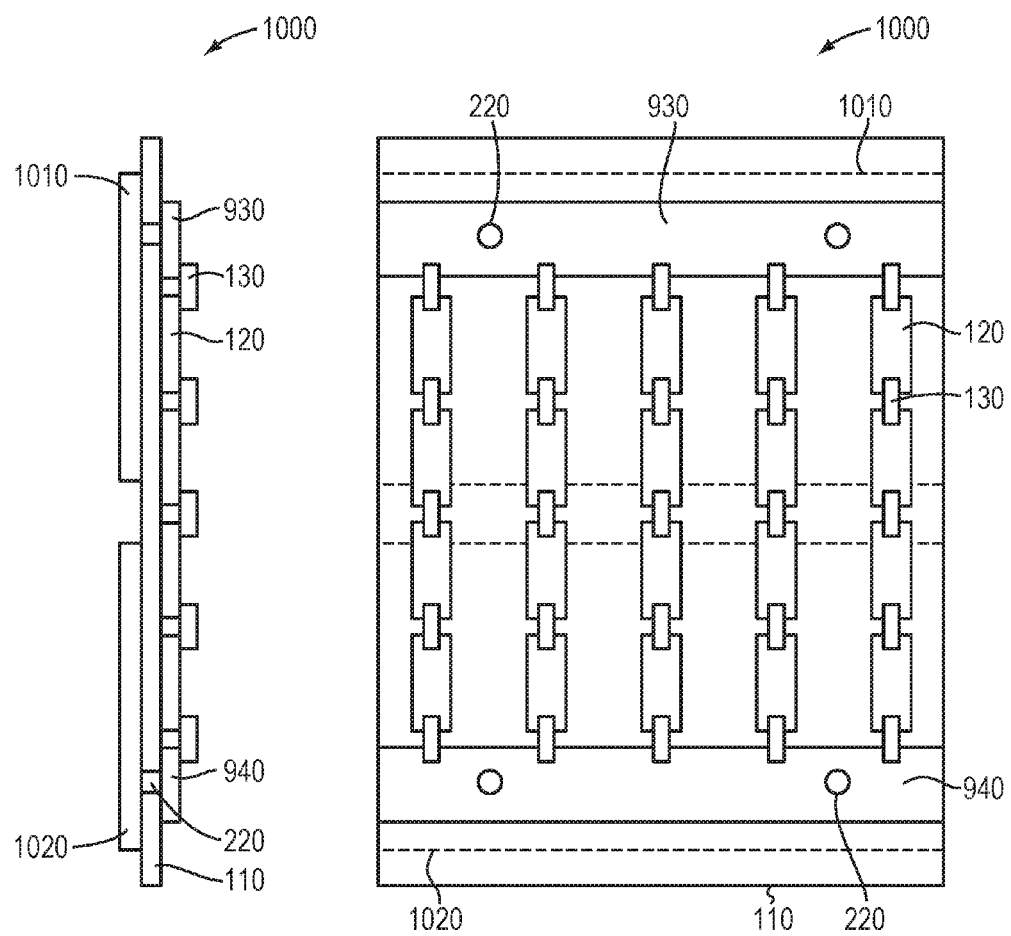
FIGS. 10A and 10B are schematic cross-sectional and plan-view illustrations, respectively, of a lighting system in accordance with various embodiments of the invention.

Various embodiments of the present invention utilize electrically conductive elements on the back of an electrical device, or lightsheet, 1000 to enhance thermal conduction away from LEEs 130, as shown in FIGS. 10A and 10B. In some embodiments, the lightsheet 1000 may include one or more conductive elements on the back of the substrate, for example on the back of substrate 110 as illustrated in FIGS. 10A and 10B. Such conductive elements, which may also be called power conductors, back power conductors, power bus, power bus lines, and/or bus lines, may be configured and used to permit much longer lightsheets while still maintaining acceptable voltage loss in the power conductor and thus acceptably high efficiency. FIGS. 10A and 10B depict an electrical device 1000 in cross-section and plan view respectively. Electrical device 1000 includes power conductors 930, 940, conductive traces 120, and LEEs 130 formed over substrate 110. Electrical device 1000 also features back power conductors 1010, 1020 that are formed on the side of substrate 110 opposite the side on which power conductors 930, 940 are formed. Back power conductors 1010, 1020 may be electrically and thermally coupled to power conductors 930, 940 respectively, using one or more vias 220.

Furthermore, one or more LEEs 130 may be bonded to traces 120 on the back side of substrate 110 in a similar or different fashion to that depicted in FIG. 10A, and/or multiple substrates 110 having LEEs 130 and traces 120 thereon may be stacked to form multi-layer devices. Referring to FIG. 10B, lightsheet 1000 features an array of LEEs 130 each electrically coupled between conductive traces 120, and power conductors 930, 940 providing power to conductive traces 120, all of which are disposed over a substrate 110. In one embodiment, the power conductors 930, 940 may be formed on the one side of the substrate 110 and electrically coupled by means of vias 220 to the conductive traces 120 on the opposite side of the substrate 110. Where vias 220 are electrically coupled to LEEs 130 and power conductors 930, 940, improved thermal conduction of heat away from the LEE 130 may occur.

In various embodiments, disposed over and at least partially surrounding the LEE 130 is a phosphor material for converting at least a portion of light emitted by the LEE 130 to light of a different wavelength. In some embodiments, the LEE 130 having a wavelength-conversion material generates white light by combining the short-wavelength radiant flux (e.g., blue light) emitted by the LEE with long-wavelength radiant flux (e.g., yellow light) emitted by the wavelength-conversion material. The chromaticity (or color), color temperature, and color-rendering index are determined by the relative intensities of the component colors. For example, the light color may be adjusted from "warm white" with a correlated color temperature (CCT) of 2700 Kelvin or lower to "cool white" with a CCT of 6500 Kelvin or greater by varying the type or amount of phosphor material. White light may also be generated solely or substantially only by the light emitted by the one or more wavelength-conversion materials.

As used herein, "phosphor" refers to any material that shifts the wavelengths of light irradiating it and/or that is fluorescent and/or phosphorescent. As used herein, a "phosphor" may refer to only the powder or particles (of one or more different types) or to the powder or particles with the binder, and in some circumstances may refer to region(s) containing only the binder (for example, in a remote-phosphor configuration in which the phosphor is spaced away from the LEE). The terms "wavelength-conversion material" and "light-conversion material" are utilized interchangeably with "phosphor" herein. The light-conversion material is incorporated to shift one or more wavelengths of at least a portion of the light emitted by LEEs to other (i.e., different) desired wavelengths (which are then emitted from the larger device alone or color-mixed with another portion of the original light emitted by the LEE). A light-conversion material may include or consist essentially of phosphor powders, quantum dots, organic dyes, or the like within a transparent binder. Phosphors are typically available in the form of powders or particles, and in such case may be mixed in binders. An exemplary binder is silicone, i.e., polyorganosiloxane, which is most commonly polydimethylsiloxane (PDMS). Phosphors vary in composition, and may include lutetium aluminum garnet (LuAG or GAL), yttrium aluminum garnet (YAG) or other phosphors known in the art. GAL, LuAG, YAG and other materials may be doped with various materials including for example Ce, Eu, etc. The specific components and/or formulation of the phosphor and/or matrix material are not limitations of the present invention.

The binder may also be referred to as an encapsulant or a matrix material. In one embodiment, the binder includes or consists essentially of a transparent material, for example silicone-based materials or epoxy, having an index of refraction greater than 1.35. In one embodiment the binder and/or phosphor includes or consists essentially of other materials, for example fumed silica or alumina, to achieve other properties, for example to scatter light, or to reduce settling of the powder in the binder. An example of the binder material includes materials from the ASP series of silicone phenyls manufactured by Shin Etsu, or the Sylgard series manufactured by Dow Corning.

While the discussion herein has mentioned blue LEEs and phosphors, that when combined produce white light, the concepts may be used with respect to LEEs emitting at any wavelength and phosphors or wavelength-conversion materials with any emission wavelengths that may in combination or alone be used to produce any color.

In general in the above discussion the arrays of semiconductor dies, light emitting elements, optics, and the like have been shown as square or rectangular arrays; however this is not a limitation of the present invention and in other embodiments these elements may be formed in other types of arrays, for example hexagonal, triangular or any arbitrary array. In some embodiments these elements may be grouped into different types of arrays on a single substrate.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:
1. An electronic device comprising:
  a substrate having first and second conductive traces on a first surface thereof, the first and second conductive traces being separated on the substrate by a gap therebetween;
  a light-emitting diode (LED) having first and second distinct electrical contacts on a first LED surface thereof, the first and second contacts being attached and electrically coupled to, respectively, the first and second conductive traces;
  a thermal pad; and
  a substrate thermal pad, wherein (i) the substrate thermal pad is disposed on the first surface of the substrate, (ii) at least a portion of the thermal pad is disposed between the first and second electrical contacts, (iii) at least a portion of the thermal pad is disposed between the substrate thermal pad and the LED, (iii) the substrate thermal pad is electrically isolated from at least one of the first or second conductive traces, (iv) the thermal pad thermally couples the LED to the substrate thermal pad without electrically coupling the LED to the substrate, (v) the thermal pad has a thermal conductivity greater than 1 W/(m·K), and (vi) the substrate thermal pad comprises one or more electrically conductive materials.

2. The electronic device of claim 1, wherein the thermal pad comprises one or more electrically conductive materials.

3. The electronic device of claim 1, wherein a surface area of the substrate thermal pad is larger than a surface area of the thermal pad.

4. The electronic device of claim 1, wherein the thermal pad is electrically isolated from at least one of the first or second conductive traces.

5. The electronic device of claim 1, wherein the thermal pad comprises a material having a thermal conductivity in the range of about 75 W/(m·K) to about 600 W/(m·K).

6. The electronic device of claim 1, wherein the substrate is flexible.

7. The electronic device of claim 1, wherein the substrate comprises at least one of polyethylene naphthalate, polyethylene terephthalate, epoxy, polycarbonate, polyethersulfone, polyester, polyimide, polyethylene, or silicone.

8. The electronic device of claim 1, wherein at least one of (i) the substrate thermal pad, (ii) the first conductive trace, or (iii) the second conductive trace comprises at least one of aluminum, copper, gold, silver, carbon, silver ink, or chromium.

9. The electronic device of claim 1, wherein (i) the LED is part of one of a plurality of light-emitting strings disposed on the first surface of the substrate and interconnected in an electric circuit, each light-emitting string comprising a plurality of LEDs spaced along and electrically interconnected in the light-emitting string.

10. The electronic device of claim 9, further comprising a power source for energizing the plurality of light-emitting strings and circuitry for controlling the current through the plurality of light-emitting strings.

11. The electronic device of claim 1, further comprising an insulating layer disposed between the thermal pad and the LED.

12. An electronic device comprising:
a substrate having first and second conductive traces on a first surface thereof, the first and second conductive traces being separated on the substrate by a gap therebetween;
a light-emitting diode (LED) having first and second distinct electrical contacts on a first LED surface thereof, the first and second contacts being attached and electrically coupled to, respectively, the first and second conductive traces; and
a thermal pad,
wherein (i) at least a portion of the thermal pad is disposed within the gap between the first and second conductive traces, (ii) at least a portion of the thermal pad is disposed between the first surface of the substrate and the LED, (iii) the thermal pad is electrically isolated from at least one of the first or second electrical contacts, (iv) the thermal pad thermally couples the LED to the substrate without electrically coupling the LED to the substrate, (v) the thermal pad has a thermal conductivity greater than 1 W/(m·K), and (vi) the thermal pad is at least one of electrically coupled to or thermally coupled to only one of the first or second conductive traces but not the other.

13. The electronic device of claim 12, wherein the thermal pad comprises one or more electrically conductive materials.

14. The electronic device of claim 12, wherein the thermal pad comprises a material having a thermal conductivity in the range of about 75 W/(m·K) to about 600 W/(m·K).

15. The electronic device of claim 12, wherein the substrate is flexible.

16. The electronic device of claim 12, wherein the substrate comprises at least one of polyethylene naphthalate, polyethylene terephthalate, epoxy, polycarbonate, polyethersulfone, polyester, polyimide, polyethylene, or silicone.

17. The electronic device of claim 12, wherein the first and second conductive traces comprise at least one of aluminum, copper, gold, silver, carbon, silver ink, or chromium.

18. The electronic device of claim 12, wherein (i) the LED is part of one of a plurality of light-emitting strings disposed on the first surface of the substrate and interconnected in an electric circuit, each light-emitting string comprising a plurality of LEDs spaced along and electrically interconnected in the light-emitting string.

19. The electronic device of claim 18, further comprising a power source for energizing the plurality of light-emitting strings and circuitry for controlling the current through the plurality of light-emitting strings.

20. The electronic device of claim 12, further comprising an insulating layer disposed between the thermal pad and the LED.

21. An electronic device comprising:
a substrate having first and second conductive traces on a first surface thereof, the first and second conductive traces being separated on the substrate by a gap therebetween;
a light-emitting diode (LED) having first and second distinct electrical contacts on a first LED surface thereof, the first and second contacts being attached and electrically coupled to, respectively, the first and second conductive traces;
a first backside thermal pad (i) disposed on a second surface of the substrate opposite the first surface, and (ii) having a thermal conductivity greater than 75 W/(m·K);
at least one first thermal via (i) extending from the first surface of the substrate to the second surface of the substrate and (ii) thermally coupling the first conductive trace to the first backside thermal pad;
a second backside thermal pad (i) disposed on the second surface of the substrate, (ii) having a thermal conductivity greater than 75 W/(m·K), and (iii) electrically isolated from the first backside thermal pad; and
at least one second thermal via (i) extending from the first surface of the substrate to the second surface of the substrate and (ii) thermally coupling the second conductive trace to the second backside thermal pad,
wherein (i) each said at least one first thermal via has a thermal resistance in the range of about 0.05° K/W to about 10° K/W, and (ii) each said at least one second thermal via has a thermal resistance in the range of about 0.05° K/W to about 10° K/W.

22. An electronic device comprising:
- a substrate having first and second conductive traces on a first surface thereof, the first and second conductive traces being separated on the substrate by a gap therebetween;
- a light-emitting diode (LED) having first and second distinct electrical contacts on a first LED surface thereof, the first and second contacts being attached and electrically coupled to, respectively, the first and second conductive traces;
- a first backside thermal pad (i) disposed on a second surface of the substrate opposite the first surface, and (ii) having a thermal conductivity greater than 75 W/(m·K); and
- at least one first thermal via (i) extending from the first surface of the substrate to the second surface of the substrate and (ii) thermally coupling the first conductive trace to the first backside thermal pad,
- wherein the at least one first thermal via comprises at least one of (i) a crimp-type via between the first and second surfaces of the substrate, (ii) a staple extending through the substrate in at least two discrete locations, (iii) a rivet extending through the substrate, (iv) a clamp extending around the substrate but not through the substrate, or (v) a wire.

23. The electronic device of claim 21, wherein the at least one first thermal via comprises a through-hole extending through the substrate and substantially filled with a thermally conductive material having a thermal conductivity greater than 10 W/(m·K).

24. The electronic device of claim 21, wherein the first and second contacts are bonded to the first and second conductive traces by an adhesive, the adhesive comprising at least one of a pressure-activated adhesive, an anisotropic conductive adhesive, a conductive adhesive, a non-conductive adhesive, a heat-activated adhesive, or a UV-activated adhesive.

25. The electronic device of claim 21, wherein the first backside thermal pad comprises one or more electrically conductive materials.

26. The electronic device of claim 21, wherein the first backside thermal pad comprises a material having a thermal conductivity in the range of about 75 W/(m·K) to about 600 W/(m·K).

27. The electronic device of claim 21, wherein the substrate is flexible.

28. The electronic device of claim 21, wherein the substrate comprises at least one of polyethylene naphthalate, polyethylene terephthalate, epoxy, polycarbonate, polyethersulfone, polyester, polyimide, polyethylene, or silicone.

29. The electronic device of claim 21, wherein at least one of (i) the first backside thermal pad, (ii) the first conductive trace, or (iii) the second conductive trace comprises at least one of aluminum, copper, gold, silver, carbon, silver ink, or chromium.

30. The electronic device of claim 21, wherein (i) the LED is part of one of a plurality of light-emitting strings disposed on the first surface of the substrate and interconnected in an electric circuit, each light-emitting string comprising a plurality of LEDs spaced along and electrically interconnected in the light-emitting string.

31. The electronic device of claim 30, further comprising a power source for energizing the plurality of light-emitting strings and circuitry for controlling the current through the plurality of light-emitting strings.

* * * * *